(12) United States Patent
Fujiki et al.

(10) Patent No.: US 6,218,889 B1
(45) Date of Patent: Apr. 17, 2001

(54) SEMICONDUCTOR INTEGRATED CIRCUIT DEVICE, AND METHOD OF MANUFACTURING THE SAME

(75) Inventors: Atsushi Fujiki, Takasaki; Tetsuo Iijima, Maebashi, both of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/206,966

(22) Filed: Dec. 8, 1998

(30) Foreign Application Priority Data

Dec. 9, 1907 (JP) .................................................. 9-338673

(51) Int. Cl.$^7$ .................................................. H01L 35/00
(52) U.S. Cl. ............................................ 327/427; 327/512
(58) Field of Search ..................................... 327/512, 427, 327/430, 431, 434, 435, 457; 361/111, 56

(56) References Cited

U.S. PATENT DOCUMENTS

| | | | |
|---|---|---|---|
| 4,667,121 | * | 5/1987 | Fay et al. .............................. 307/580 |
| 4,845,543 | * | 7/1989 | Okikawa et al. ....................... 357/67 |
| 4,896,199 | * | 1/1990 | Tsuzuki et al. ........................ 357/28 |
| 5,369,308 | * | 11/1994 | Schoofs et al. ....................... 327/427 |
| 5,432,471 | * | 7/1995 | Majumdar et al. ................... 327/380 |
| 5,650,737 | * | 7/1997 | Eilley .................................. 327/108 |
| 5,767,545 | * | 6/1998 | Takahashi ............................ 257/341 |
| 5,796,278 | * | 8/1998 | Osborn et al. ....................... 327/108 |
| 5,801,573 | * | 9/1998 | Kelly et al. .......................... 327/434 |

FOREIGN PATENT DOCUMENTS

| | | | |
|---|---|---|---|
| 5-67661 | 3/1993 | (JP) | .............................. H01L/29/78 |
| 7-142711 | 6/1995 | (JP) | .............................. H01L/29/78 |
| 7-283370 | 10/1996 | (JP) | .............................. H01L/27/04 |

* cited by examiner

*Primary Examiner*—Toan Tran
*Assistant Examiner*—Linh Nguyen
(74) *Attorney, Agent, or Firm*—Mattingly, Stanger & Malur, P.C.

(57) ABSTRACT

A power MOSFET Qp and a protection circuit 3 are formed over a semiconductor substrate to constitute a construction in which the power MOSFET Qp and the protection circuit 3 are electrically separated from each other. Then, a screening voltage is applied between the gate electrode and the source electrode of the power MOSFET Qp which is electrically separated from the protection circuit 3, thereby eliminating a power MOSFET Qp having a latent defect. Subsequently, a non-defective power MOSFET Qp and the protection circuit 3 are electrically connected by a bonding wire.

18 Claims, 21 Drawing Sheets

FIG. 8

|  | SCREENING | PROBE SCREENING |
|---|---|---|
| PROBE NEEDLE 1 14a | OPEN | VG |
| PROBE NEEDLE 2 14b | VG | VG |
| PROBE NEEDLE 3 14c | GND | GND |
| PROBE NEEDLE 4 14d | OPEN | GND |
| REVERSE SURFACE STAGE | GND | VD |

SEMICONDUCTOR INTEGRATED CIRCUIT DEVICE, AND METHOD OF MANUFACTURING THE SAME

FIELD OF THE INVENTION

The present invention relates to a method of manufacturing a semiconductor integrated circuit device and semiconductor integrated circuit device technology and, more particularly, to an art which can be usefully applied to a so-called semiconductor integrated circuit device to be employed in a circuit which uses a large amount of power, whose device has a power MIS (Metal Insulator Semiconductor) transistor having a gate insulating film or a power MOS (Metal Oxide Semiconductor) transistor having a gate oxide film, as well as to a method of manufacturing such semiconductor integrated circuit device.

BACKGROUND OF THE INVENTION

Power MIS transistors have high breakdown voltage (withstand voltage), high thermal stability and high gain, and can be easily used to realize a construction for power amplification. For this reason, the power MIS transistors are widely used as power devices for switching power sources, motor control power devices, power devices for vehicles or the like, and, in recent years, have been becoming finer and finer to realize far higher performance.

In many cases, to ensure a certain degree of electrostatic breakdown strength, a protection diode (a zener diode) is provided in a semiconductor chip in which a power MIS transistor is formed, and the protection diode is electrically connected between the gate and the source of the power MIS transistor.

In some types of power MIS transistors having built-in protection functions, not only a protection diode but also another protection circuit such as a thermal sense circuit is provided in a semiconductor chip in which a power MIS transistor is formed, and such protection circuit is electrically connected to between the gate and the source of the power MIS transistor.

In general, such power MIS transistor uses a package having a three-terminal structure. In this case, a gate electrode and a source electrode are disposed on a principal surface of the semiconductor chip in which the power MIS transistor is formed, and a drain terminal is disposed on the reverse surface of the semiconductor chip.

SUMMARY OF THE INVENTION

However, the present inventors have found out that the above-described semiconductor integrated circuit device technology of providing a power MIS transistor and other elements or circuits in a single semiconductor chip has the following problems.

One problem is that since a protection circuit or the like is connected to the power MIS transistor, a voltage which is necessary for screening of the power MIS transistor itself cannot be applied in a screening step, so that a satisfactory screening effect cannot be realized.

In a device such as a power MIS transistor whose gate insulating film has a large area, since defects in the gate insulating film often cause a breakdown of an element or a defective characteristic, it is important to ensure the reliability of the gate insulating film. Normally, a gate insulating film (silicon oxide film) of approximately 500Å thick has an intrinsic withstand voltage of approximately 40 V, and needs a screening voltage of approximately 30 V. However, in a power MIS transistor in which a protection diode (a zener diode) or the like is electrically connected between the gate and the source (or the gate and the drain) of the power MIS transistor, a screening voltage is set to a value as close as possible to the guaranteed withstand voltage of the power MIS transistor in terms of the zener voltage of the protection diode in order to ensure a satisfactory level of electrostatic breakdown strength. As a result, it is merely possible to apply a voltage of approximately as low as 22 V which is far lower than a desired voltage (for example, approximately 30 V). In addition, in the power MIS transistor which includes the protection circuit, a gate voltage is clamped by a zener diode and, at the same time, the screening voltage is limited by the withstand voltage of a lateral MIS transistor which constitutes another circuit (the protection circuit), so that a screening voltage of approximately as low as 24 V can only be applied. Incidentally, the thickness of a gate insulating film (a gate oxide film) of the lateral MIS transistor which constitutes the aforesaid other circuit (the protection circuit) is generally smaller than that of a gate insulating film (a gate oxide film) of the power MIS (MOS) transistor. Accordingly, the lateral MIS transistor is lower in withstand voltage than the power MIS (MOS) transistor.

One available method for avoiding such a problem is to increase the time of application of the screening voltage. However, if satisfactory screening is to be performed with a low voltage, the time of application of the screening voltage needs to be increased, so that the problem of a longer inspection time occurs.

Arts which take into account the above-described problems of the power MIS transistor are disclosed in, for example, Japanese Patent Laid-Open Nos. 67661/1993, 142711/1995 and 283370/1995.

The above-identified Japanese Patent Laid-Open No. 67661/1993 discloses a structure in which two constant-voltage diodes having different withstand voltages are provided between the gate and the source of a power MOSFET (Metal Oxide Semiconductor Field Effect Transistor). In this structure, during screening, a switching element is turned off, and a screening voltage is applied to the gate and the source of the power MOSFET with a constant-voltage diode of lower withstand voltage being isolated from the power MOSFET, and after screening, the switching element is turned on and the constant-voltage diode of lower withstand voltage is electrically connected between the gate and the source of the power MOSFET. However, in this art, the number of terminals to be led out from a semiconductor chip is increased and compatibility with normal three-terminal packages becomes a problem, and, in addition, the number of elements increases and the circuit construction becomes complicated.

The above-identified Japanese Patent Laid-Open No. 142711/1995 discloses a structure in which a gate voltage applying circuit is provided at the front stage of the gate of a power MOSFET. In this art, a zener diode which sets a gate voltage to be used during the operation of the power MOSFET and a zener diode which adds voltages together and applies the voltage sum during an inspection of a gate voltage are connected in series, and, during the inspection of a gate voltage, a switching element is turned off to apply the voltage obtained by adding together the zener voltages of both zener diodes. However, in this art as well, the number of terminals to be led out from a semiconductor chip is increased and compatibility with normal three-terminal packages becomes a problem, and, in addition, the number of elements increases and the circuit construction becomes complicated.

The above-identified Japanese Patent Laid-Open No. 283370/1995 discloses an art which provides the gate electrode of a power MOSFET with a testing gate terminal and executes a gate check test by applying a high voltage to the test gate terminal, and which provides a level shifting circuit unit for lowering a voltage to be applied to a control circuit, in order to prevent a high voltage from being applied to the side of the control circuit. However, in this art as well, the number of terminals to be led out from a semiconductor chip is increased and compatibility with normal three-terminal packages becomes a problem, and, in addition, since the level shifting circuit unit is newly added, the number of elements increases and the circuit construction becomes complicated.

An object of the present invention is to provide an art which is capable of rapidly and effectively performing screening on a semiconductor integrated circuit device in which a power MIS transistor and other circuits are provided on a single semiconductor substrate.

Another object of the present invention is to provide an art which is capable of rapidly and effectively performing screening on a semiconductor integrated circuit device in which a power MIS transistor and other circuits are provided on a single semiconductor substrate, without the need to complicate the entire circuit construction.

Another object of the present invention is to provide an art which is capable of improving the reliability of a semiconductor integrated circuit device in which a power MIS transistor and other circuits are provided on a single semiconductor substrate.

Another object of the present invention is to provide an art which is capable of improving the quality control ability of a semiconductor integrated circuit device in which a power MIS transistor and other circuits are provided on a single semiconductor substrate.

The above and other objects and novel features of the present invention will become apparent from the following description taken in conjunction with the accompanying drawings.

Representative aspects of the invention disclosed herein will be described below in brief.

A semiconductor integrated circuit device according to the present invention comprises:
  a first terminal, a second terminal, a third terminal and a fourth terminal,
  an insulated gate transistor having a first current path coupled between said second terminal and said third terminal, and a gate terminal coupled to said first terminal; and
  a protection circuit which prevents a breakdown of a first gate insulating film in said insulated gate transistor, and which is coupled between said third terminal and said fourth terminal.

A method for manufacturing a semiconductor integrated circuit device according to the present invention is a method for manufacturing a semiconductor integrated circuit device which has a power MIS transistor and a peripheral circuit provided over a single semiconductor substrate, comprising the steps of:
  (a) forming the power MIS transistor and the peripheral circuit over the single semiconductor substrate to constitute a construction in which the power MIS transistor and the peripheral circuit is electrically separated from each other;
  (b) after the above step (a), applying a screening voltage between a gate electrode and a source electrode of the power MIS transistor which is electrically separated from the peripheral circuit; and
  (c) after the above step (b), electrically connecting the power MIS transistor and the peripheral circuit.

A method for manufacturing a semiconductor integrated circuit device according to the present invention further comprises, in the above step (c), bonding the power MIS transistor and the peripheral circuit.

In a method of manufacturing a semiconductor integrated circuit device according to the present invention, the construction in which the power MIS transistor and the peripheral circuit are electrically separated from each other includes:
  a power MIS transistor gate terminal which is electrically connected to the gate electrode of the power MIS transistor;
  a peripheral circuit power source terminal which is electrically connected to the peripheral circuit;
  a power MIS transistor source terminal which is electrically connected to the source electrode of the power MIS transistor; and
  a peripheral circuit GND terminal which is electrically connected to the peripheral circuit,
    the peripheral circuit GND terminal being provided over a field insulating film on the semiconductor substrate within an area in which the power MIS transistor is formed.

Otherwise, a method for manufacturing a semiconductor integrated circuit device according to the present invention comprises: forming in an epitaxial layer of the semiconductor substrate a first semiconductor area which is of the same conductivity type as an impurity of a channel region of a power MIS transistor and is lower in impurity concentration than the channel region; and forming in the first semiconductor area a semiconductor area for a source and a drain of a lateral MIS transistor which constitutes the peripheral circuit.

BRIEF DESCRIPTION OF THE DRAWINGS

FIG. 8 is an explanatory view of voltages to be applied to individual portions of the semiconductor integrated circuit device in the screening step;

FIGS. 14(a) to 14(d) are explanatory views aiding in explaining the relation between gate voltage and gate breakdown occurrence frequency in a normal power IC examined by the present inventors;

DETAILED DESCRIPTION

Figure 1:
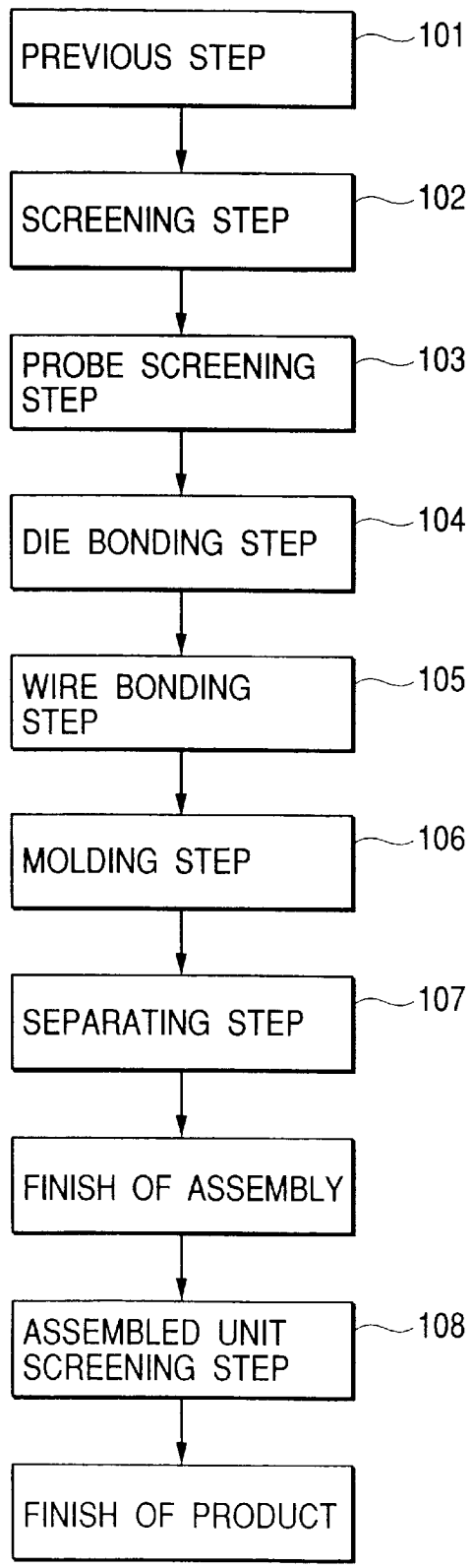
FIG. 1 is a flowchart showing the process of manufacturing a semiconductor integrated circuit device according to one embodiment of the present invention.

Embodiments of the present invention will be described below in detail with reference to the accompanying drawings. (Throughout all drawings illustrating the embodiments, identical reference numerals are used to denote constituent elements having identical functions, and the repetition of identical descriptions is omitted.)

First Embodiment

Figure 2:
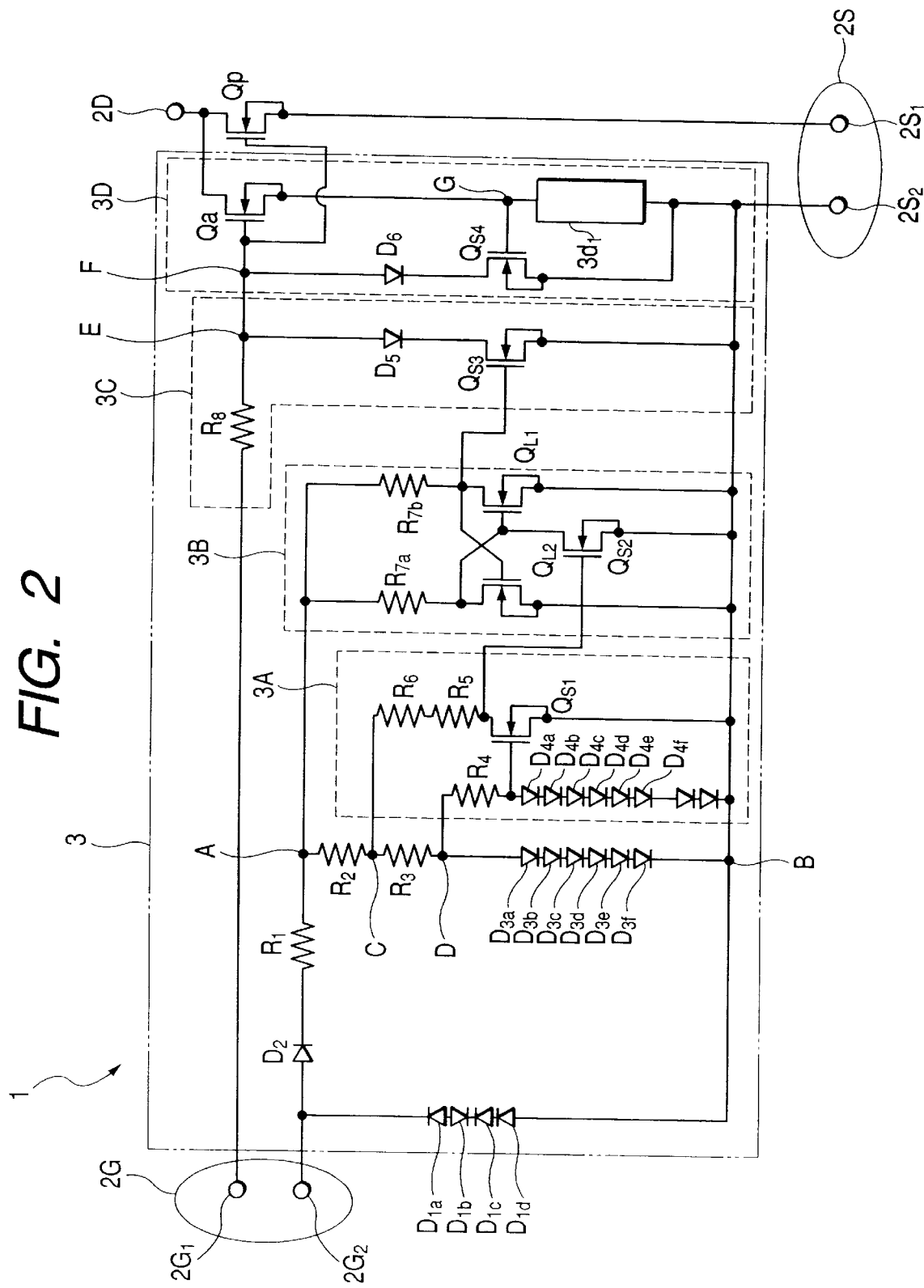
FIG. 2 is a diagram of the equivalent circuit of the semiconductor integrated circuit device which is obtained at an intermediate stage in the process (shown in FIG. 1) of manufacturing the semiconductor integrated circuit device.
Figure 3:
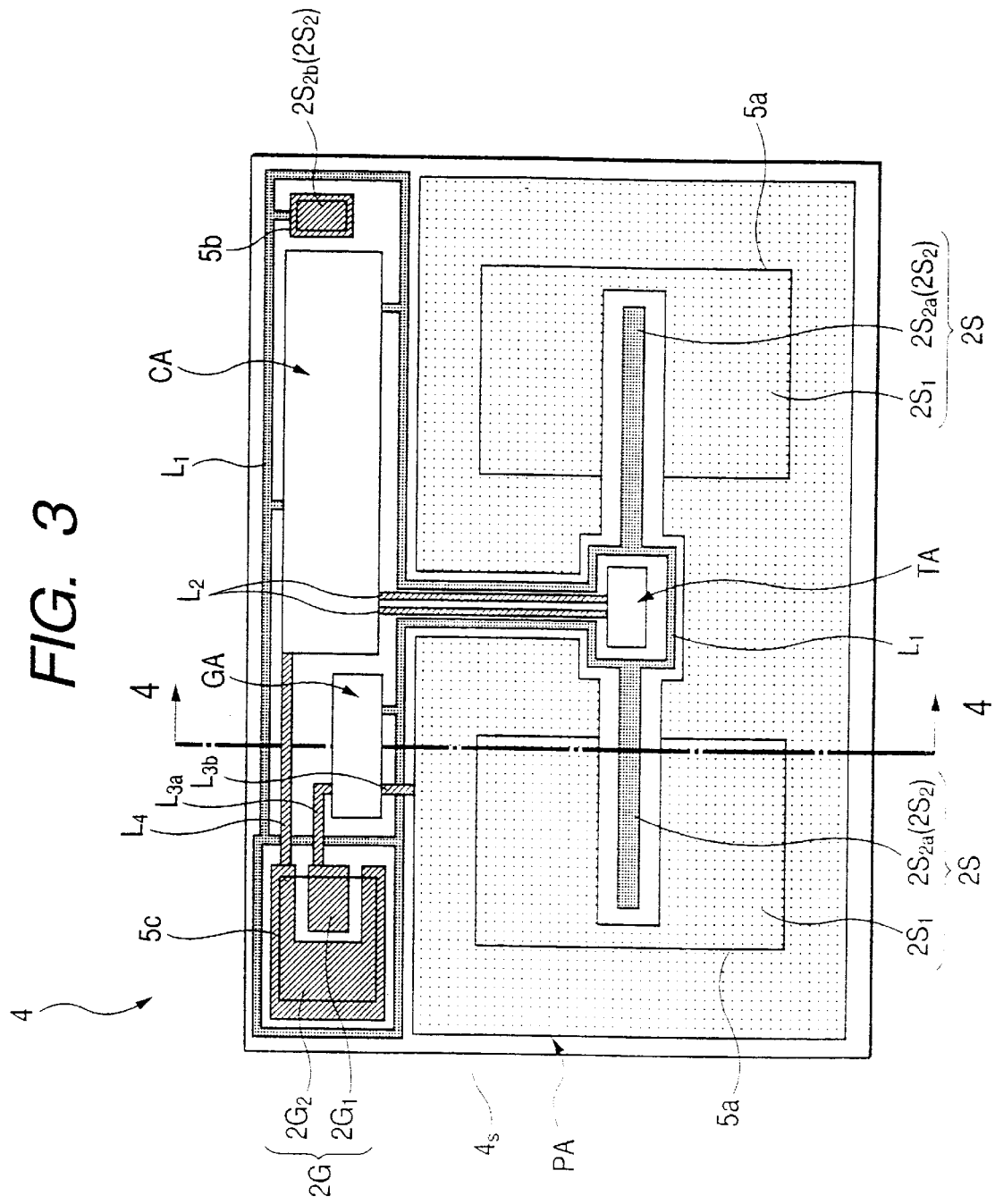
FIG. 3 is a plan view of a semiconductor chip in a semiconductor wafer which is obtained at an intermediate stage in the process (shown in FIG. 1) of manufacturing the semiconductor integrated circuit device.
Figure 4:
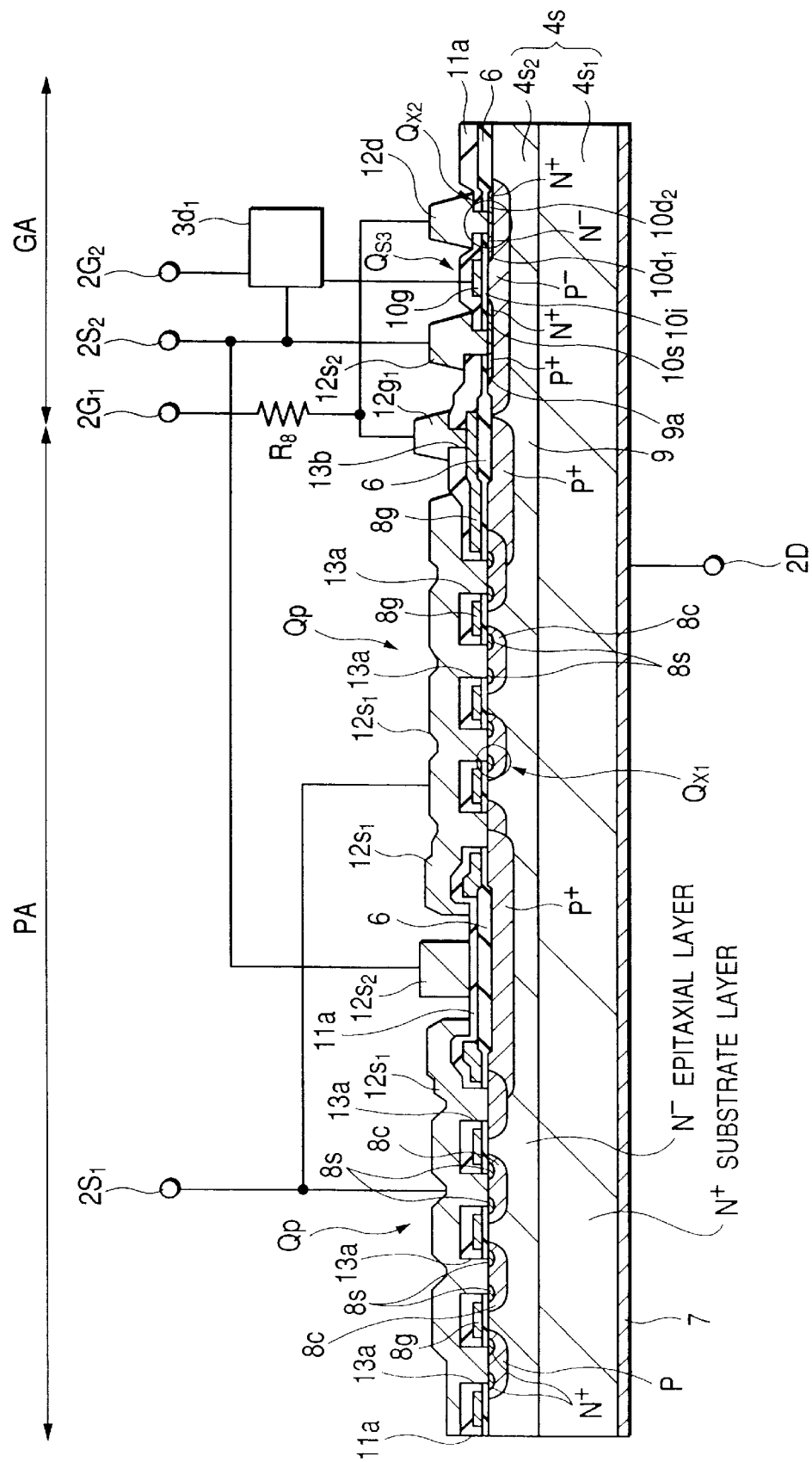
FIG. 4 is a cross-sectional view of an essential portion of the semiconductor integrated circuit device taken along line 4—4 of FIG. 3.
Figure 5:
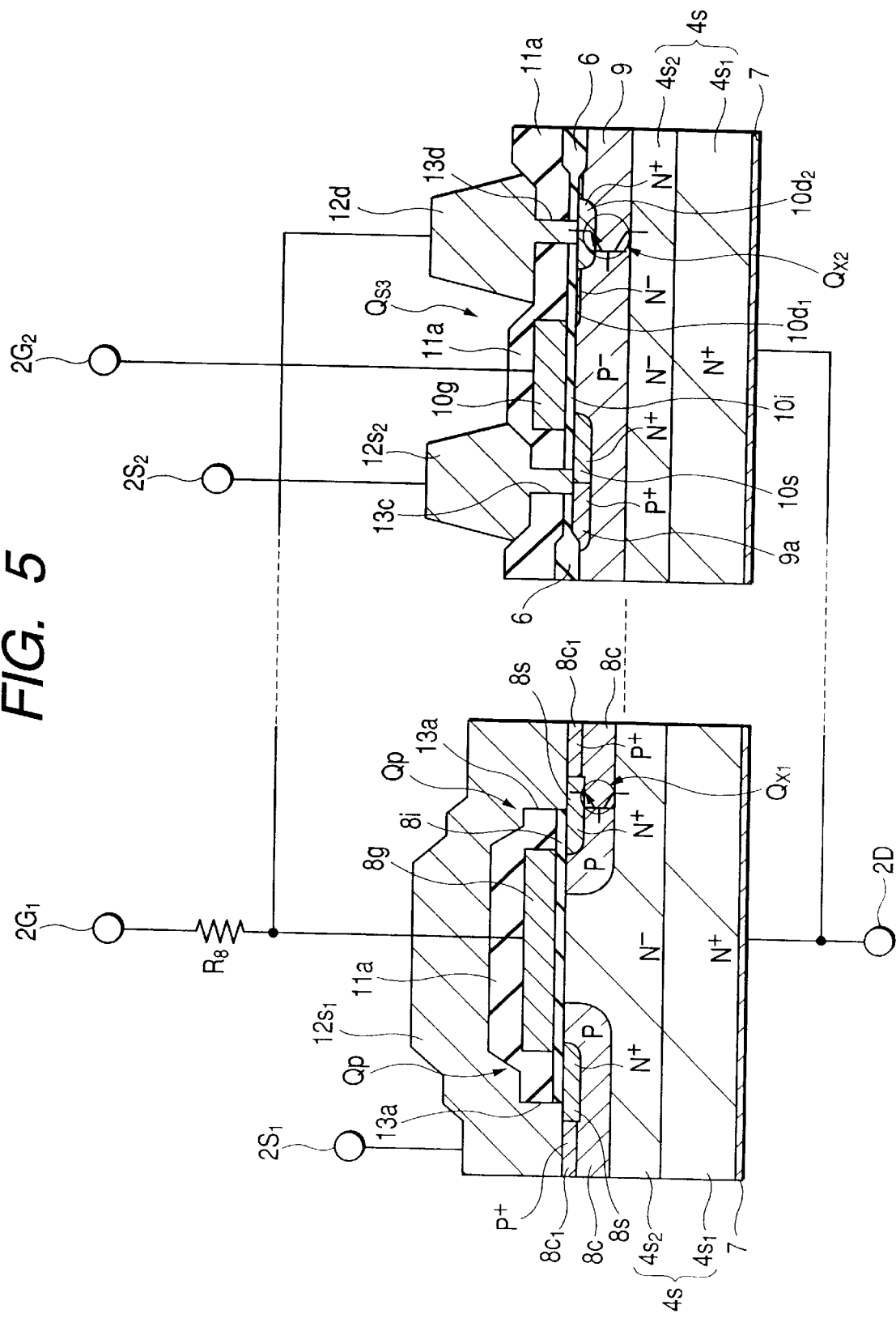
FIG. 5 is an enlarged cross-sectional view of an essential portion of the semiconductor integrated circuit device shown in FIG. 4.
Figure 6:
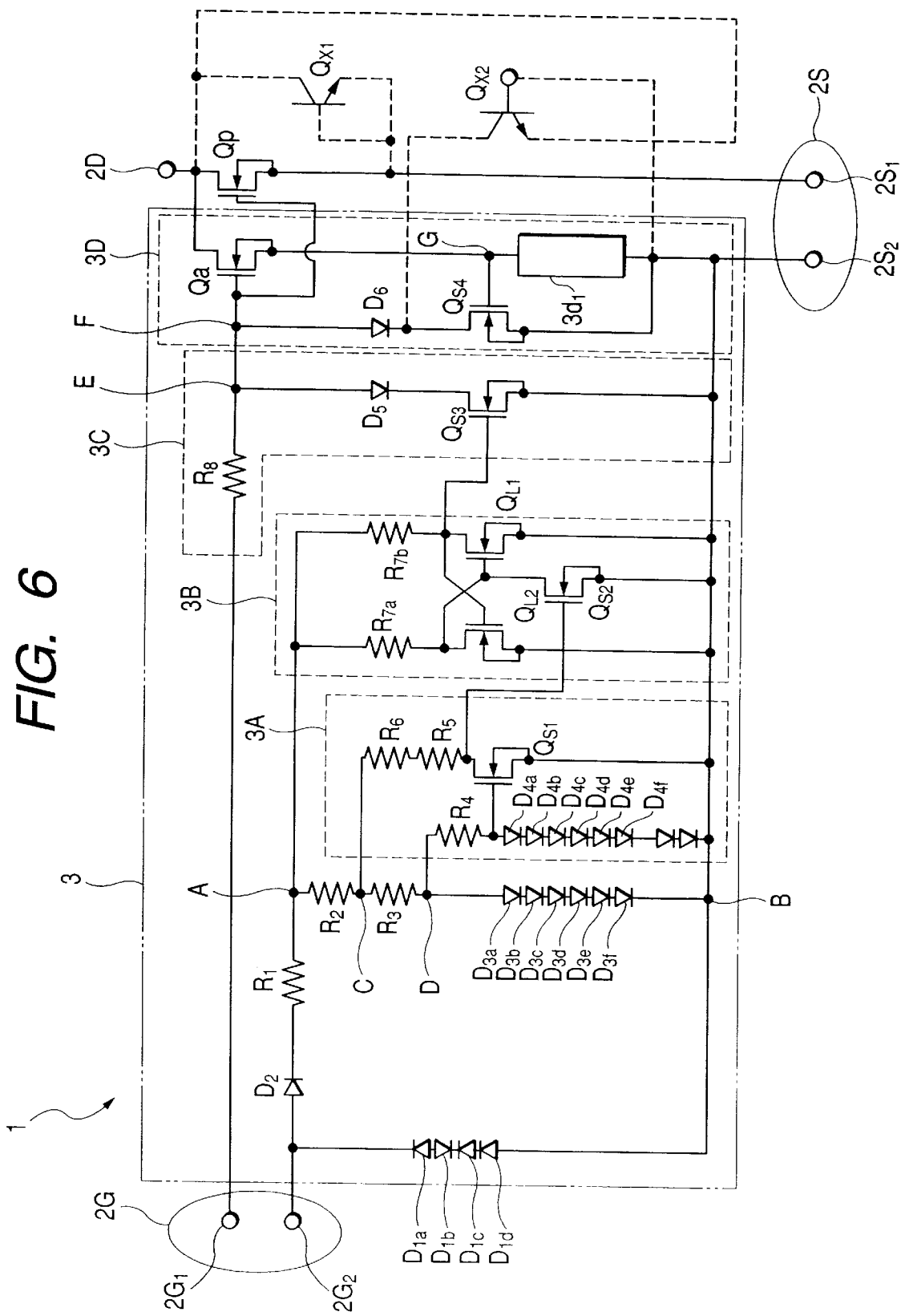
FIG. 6 is a diagram of an equivalent circuit of the semiconductor integrated circuit device, showing parasitic elements in a screening step.
Figure 7:
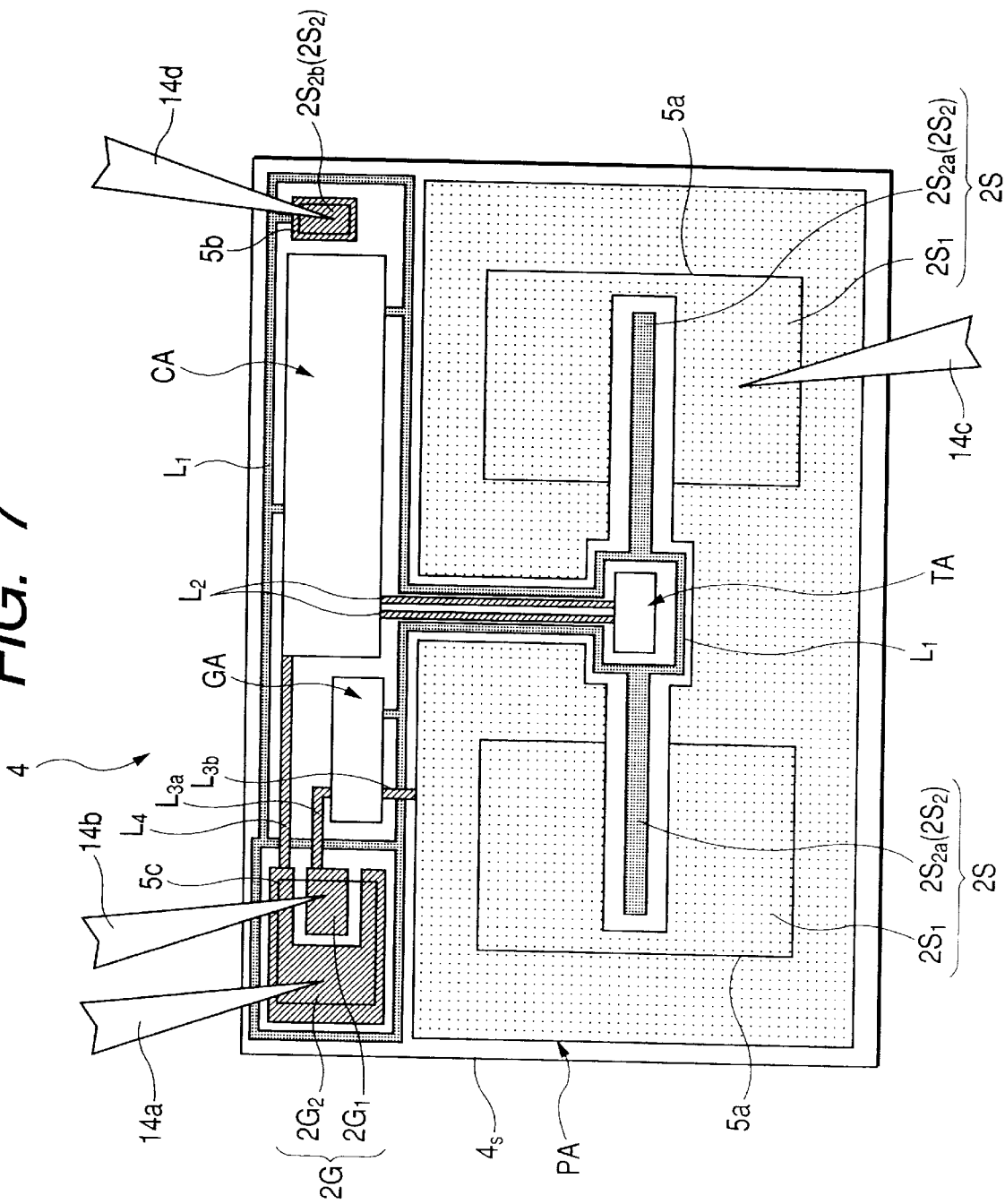
FIG. 7 is a plan view of a semiconductor chip of the semiconductor wafer in the screening step.
Figure 9:
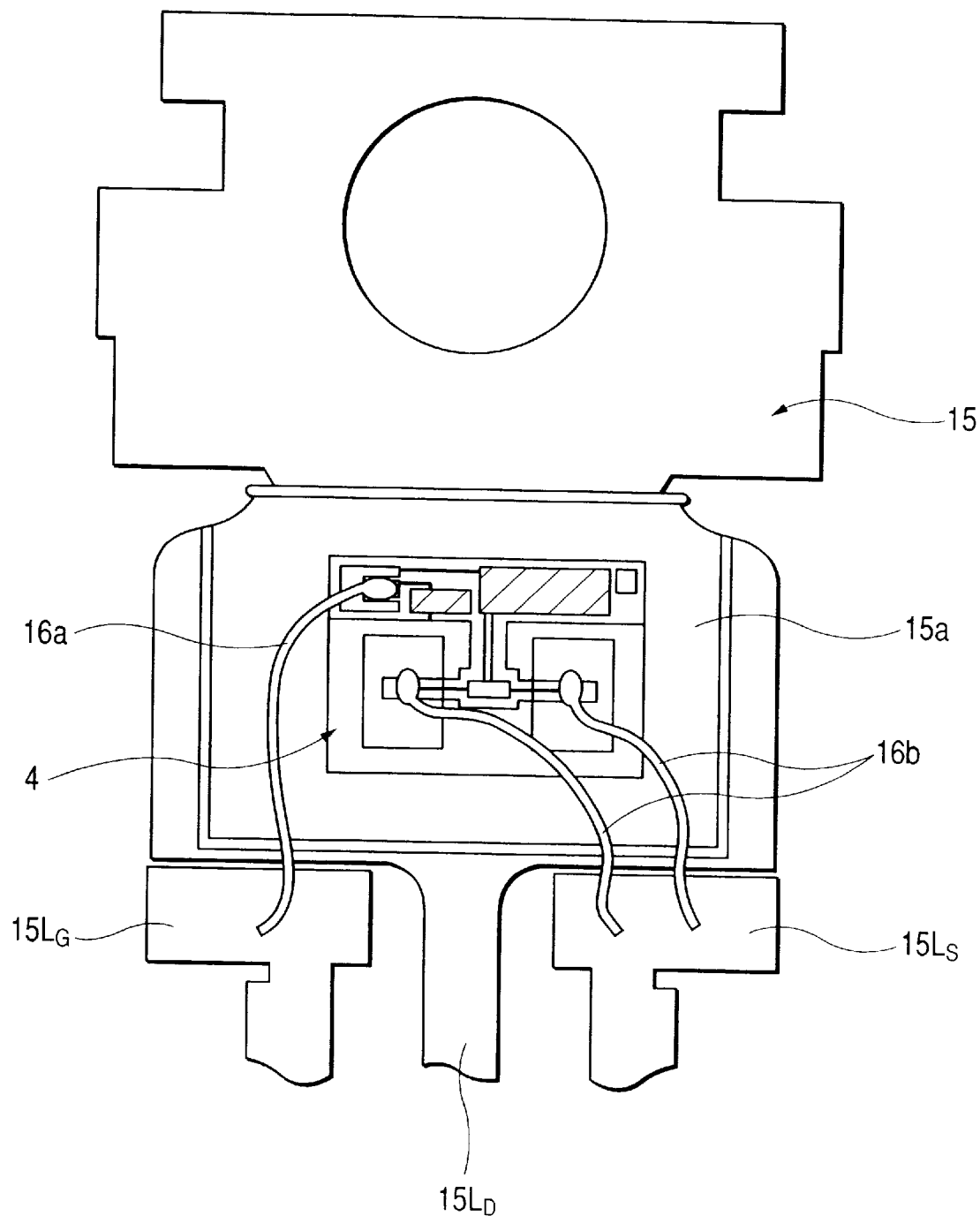
FIG. 9 is a plan view of an essential portion of the semiconductor integrated circuit device after a wire bonding step.
Figure 10:
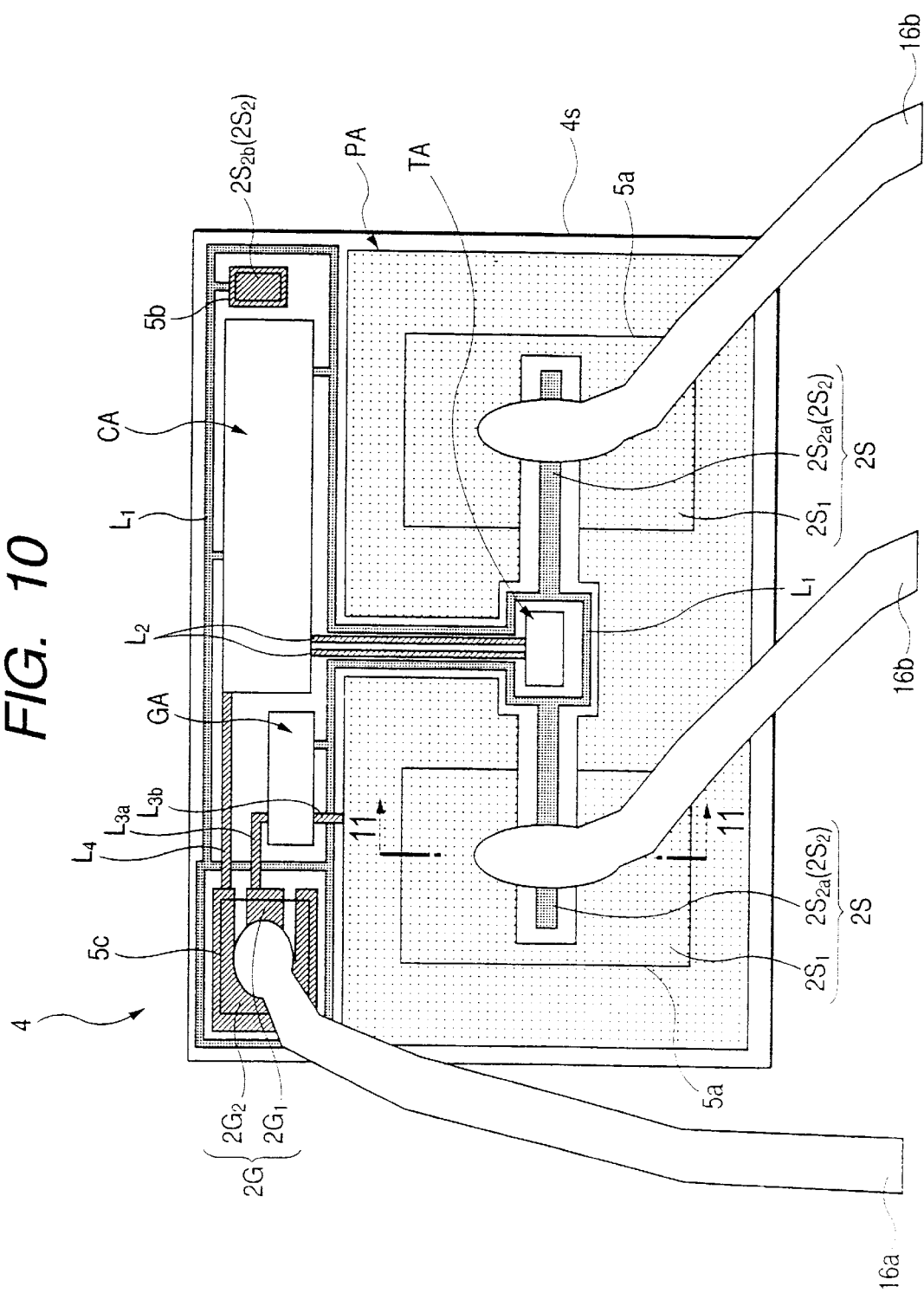
FIG. 10 is an enlarged plan view of an essential portion of the semiconductor integrated circuit device shown in FIG. 9.
Figure 11:
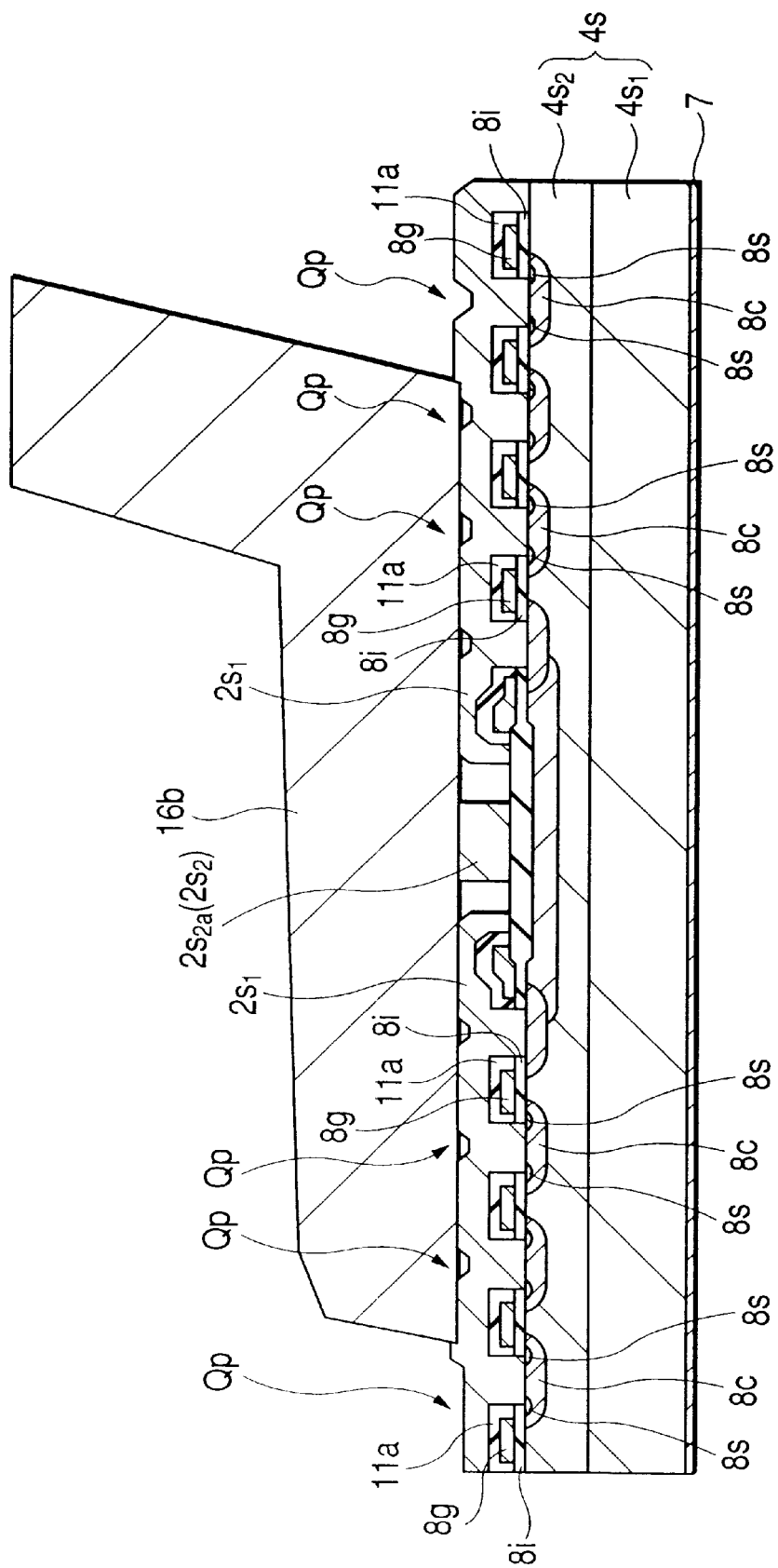
FIG. 11 is an enlarged cross-sectional view of an essential portion taken along line 11—11 of FIG. 10.
Figure 12:
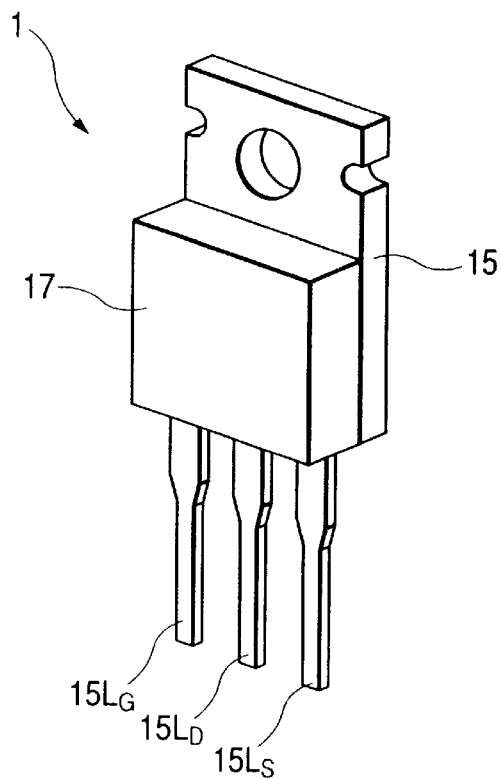
FIG. 12 is a perspective view of the whole of a finished semiconductor integrated circuit device.

FIG. 1 is a flowchart showing the process of manufacturing a semiconductor integrated circuit device according to one embodiment of the present invention, FIG. 2 is a diagram of the equivalent circuit of the semiconductor integrated circuit device which is obtained at an intermediate stage in the process (shown in FIG. 1) of manufacturing the semiconductor integrated circuit device, FIG. 3 is a plan view of a semiconductor chip in a semiconductor wafer which is obtained at an intermediate stage in the process (shown in FIG. 1) of manufacturing the semiconductor integrated circuit device, FIG. 4 is a cross-sectional view of an essential portion of the semiconductor integrated circuit device shown in FIG. 3, FIG. 5 is an enlarged cross-sectional view of an essential portion of the semiconductor integrated circuit device shown in FIG. 4, FIG. 6 is a diagram of an equivalent circuit of the semiconductor integrated circuit device, showing parasitic elements in a screening step, FIG. 7 is a plan view of a semiconductor chip of the semiconductor wafer in the screening step, FIG. 8 is an explanatory view of voltages to be applied to individual portions of the semiconductor integrated circuit device in the screening step, FIG. 9 is a plan view of an essential portion of the semiconductor integrated circuit device after a wire bonding step, FIG. 10 is an enlarged plan view of an essential portion of the semiconductor integrated circuit device shown in FIG. 9, FIG. 11 is an enlarged cross-sectional view of an essential portion taken along line Y—Y of FIG. 10, FIG. 12 is a perspective view of the whole of a finished semiconductor integrated circuit device, FIGS. 13(a) to 13(d) are explanatory views aiding in explaining the relation between gate voltage and gate breakdown occurrence frequency in the semiconductor integrated circuit device shown in FIG. 12, and FIGS. 14(a) to 14(c) are explanatory views aiding in explaining the relation between gate voltage and gate breakdown occurrence frequency in a normal power IC examined by the present inventors.

A semiconductor integrated circuit device according to a first embodiment is a built-in overheat cutoff circuit (additional circuit) type of power IC (Integrated Circuit) which is used as, for example, a switch for a headlamp for an automobile or a power switch for an ignition of an engine.

First of all, the process of manufacturing the power IC according to the first embodiment will be described with reference to FIG. 1. This manufacturing process itself is identical to the process of manufacturing a normal power IC. Specifically, after a previous step 101, testing steps such as a screening step 102 and a probe screening step 103 are executed, and then assembly steps such as a die bonding step 104, a wire bonding step 105, a molding step 106 and a separating step 107 are executed. After such assembly has been finished, an assembled-product screening step 108 is executed and the manufacture of a product is completed.

The previous step 101 is the step of preparing a semiconductor wafer as a starting material, forming elements and electrode lines on the semiconductor wafer, coating the semiconductor wafer with a surface protection film, and bringing a plurality of semiconductor chips formed on the semiconductor wafer into the state in which each of the semiconductor chips can be subjected to an electrical characteristic test using a prober or the like.

The screening step 102 is the step of eliminating products having latent defects by subjecting each of the semiconductor chips formed on the semiconductor wafer to a test relative to a failure mechanism in order to ensure the quality and reliability level of products.

The probe screening step 103 is the step of performing screening to separate non-defective chips from defective chips by performing a test as to the electrical characteristic of each of the semiconductor chips formed on the semiconductor wafer.

The separating step 107 is the step of separating into individual packages a plurality of power IC packages which have been integrally formed on a leadframe in a line after the molding step 106. The assembled-product screening step 108 is the step of performing screening to separate nondefective packages from defective packages by inspecting the external appearance and the electrical characteristic of each of the power IC packages.

The structure of a power IC which is obtained immediately before the screening step 102 following the previous step 101 will be described below. An equivalent circuit of the power IC at this stage is shown in FIG. 2.

A power IC 1 includes a gate terminal 2G, a drain terminal 2D, a source terminal 2S, a protection circuit (peripheral circuit) 3 and a power MOSFET Qp. At this stage, the protection circuit 3 is not electrically connected between the gate and source electrodes of the power MOSFET Qp, and the power IC 1 is not completely finished. Although FIG. 2 representatively shows one power MOSFET Qp for the sake of simplicity of illustration, a plurality of power MOSFETS Qp are actually formed as will be described later.

The gate terminal 2G is a terminal for supplying an input signal to the power IC 1 and, at this stage, is divided into two terminals, a power MOSFET gate terminal 2G1 and a (peripheral circuit-connected) first power source terminal 2G2. The power MOSFET gate terminal 2G1 is a terminal for applying a screening voltage to the power MOSFET Qp, and is electrically connected to the gate electrode of the power MOSFET Qp through a line. The (peripheral circuit-connected) first power source terminal 2G2 is electrically connected to the protection circuit 3 through a line. The power MOSFET gate terminal 2G1 and the (peripheral circuit-connected) first power source terminal 2G2 are disposed on a semiconductor chip which will be described later, and are electrically connected to each other by, for example, one bonding wire after screening.

The reason why the gate terminal 2G is divided is as follows. The previously-described protection diodes (D1a, D1b, D1c and D1d) are coupled between the gate and source terminals of a power MIS transistor which is an object to be tested, and a voltage to be originally applied (a screening voltage for guaranteeing a withstand voltage) cannot be applied to the gate terminal (gate insulating film) of the power MIS transistor to a sufficient extent. Accordingly, a gate terminal (2G1) to which the screening voltage is to be applied and a gate terminal (2G2) to which the screening voltage is not to be applied are formed on a semiconductor substrate in a separate (divided) state, so that the screening voltage can be applied to the gate terminal (gate insulating film) of the power MIS transistor to a sufficient extent. The protection circuit 3 (a thermal sense circuit unit 3A and a latch circuit unit 3B both of which will be described later, as well as the above-described protection diodes) is coupled to the gate terminal (2G2) which is formed in the separate state. This is because elements (transistors, resistance elements and the above-described protection diodes) which constitute the protection circuit 3 are lower in withstand voltage than the power MIS transistor and it is necessary to prevent such elements from being broken down by the screening voltage.

Although the protection circuit 3 is separated from the power MIS transistor by separating (dividing) the gate terminal 2G in the above-described state, the power MIS transistor and the protection circuit 3 (a gate cutoff circuit unit 3C and a current limiting circuit unit 3D both of which will be described later) may also be separated from each other by separating (dividing) the source terminal 2S instead of the gate terminal 2G. Otherwise, each of the gate terminal 2G and the source terminal 2S may be formed to be separated into two terminals, and some circuits (the thermal sense circuit unit 3A and the latch circuit unit 3B both of which will be described later, as well as the above-described protection diodes) of the protection circuit 3 may be coupled to the separated gate terminal 2G and the other circuits (the gate cutoff circuit unit 3C and the current limiting circuit unit 3D both of which will be described later) of the protection circuit 3 may be coupled to the separated source terminal 2S. If the problem of layout of each of the elements makes it difficult to mutually couple individual terminals into which the gate terminal or the source terminal is separated, by using a bonding wire or the like at a later time, coupling between the respective terminals can be made easy by combining the gate terminal and the source terminal which are separated in the above-described manner. The drain terminal 2D is a terminal for supplying a source voltage of high potential to the power IC 1, and is electrically connected to the drain electrode of the power MOSFET Qp and the protection circuit 3. As will be described later, this drain terminal 2D is formed on the reverse surface of the semiconductor chip without being separated.

The source terminal 2S is a terminal for supplying a reference potential (for example, 0 V) to the power IC 1 and, at this stage, is divided into two terminals, a power MOSFET source terminal 2S1 and a (peripheral circuit-connected) second power source terminal 2S2. The power MOSFET source terminal 2S1 is electrically connected to the source electrode of the power MOSFET Qp, and the (peripheral circuit-connected) second power source terminal 2S2 is electrically connected to the protection circuit 3. The power MOSFET source terminal 2S1 and the (peripheral circuit-connected) second power source terminal 2S2 are disposed on the semiconductor chip which will be described later, and are electrically connected to each other after screening.

The reason why the source terminal 2S is divided is as follows. MOSFETs which are smaller in withstand voltage (the withstand voltage of a gate oxide film) than the power MOSFET Qp (a power transistor) are incorporated in the protection circuit 3 of the power IC 1, and if the MOSFETS of small withstand voltage are not separated from the power IC circuit during a screening step and a probe screening step, the MOSFETs will be broken down during the screening step or the probe screening step. Accordingly, it is necessary to divide the source terminal 2S to prevent such breakdown. The protection circuit 3 includes the protection diodes (zener diodes) D1a, D1b, D1c and D1d, a protection diode D2, a protection resistor R1, resistors R2 and R3, diodes D3a to D3f, the thermal sense circuit unit 3A, the latch circuit unit 3B, the gate cutoff circuit unit 3C and the current limiting circuit unit 3D.

The protection diodes D1a to D1d are elements for protecting the gate insulating film of the power MOSFET Qp from a breakdown due to an overvoltage (overcurrent), and are connected in series between the (peripheral circuit-connected) first power source terminal 2G2 and the (peripheral circuit-connected) second power source terminal 2S2 (finally, between the gate terminal 2G and the source terminal 2S). The protection diode D1b has a lower withstand voltage than the protection diode D2, and is connected in the opposite direction to the other protection diodes D1b, D1c and D1d and has the function of passing an overcurrent which flows through the gate terminal 2G, to the (peripheral circuit-connected) second power source terminal 2S2.

The protection diode D2 and the protection resistor R1 are connected in series in that order from the terminal 2G2 between the (peripheral circuit-connected) first power source terminal 2G2 and a node A (finally, between the gate terminal 2G and the node A). The resistors R2 and R3 and the diodes D3a to D3f are elements which serve to set the input voltage of the thermal sense circuit unit 3A and the source voltage, and are connected in series between the node A and a node B, i.e., between the (peripheral circuit-connected) first power source terminal 2G2 and the (peripheral circuit-connected) second power source terminal 2S2 (finally, between the gate terminal 2G and the source terminal 2S).

The thermal sense circuit unit 3A of the power IC 1 is a circuit unit which detects the temperature of the power IC 1 during the operation thereof and, if the detected value reaches a predetermined value (a predetermined temperature), turns off the power IC 1, and includes an n-channel type of MOSFET Qsl, resistors R4 to R6, and diodes D4a to D4g for thermal sense.

The drain electrode of the MOSFET Qs1 is electrically connected to a node C between the resistors R2 and R3 via resistors R5 and R6, the gate electrode of the MOSFET Qs1 is electrically connected to a node D between the resistor R3 and the diode D3a via the resistor R4, and the source electrode of the MOSFET Qs1 is incorporated in the circuit in the state of being electrically connected to the peripheral circuit-connected GND terminal 2S (finally, the source terminal 2S). The resistor R4 is an element for limiting a current which flows to the MOSFET Qs1. The resistors R5 and R6 are elements for setting the output voltage of the thermal sense circuit unit 3A.

Diodes D4a to D4g are electrically connected between the gate and the source of the MOSFET Qs1. These diodes D4a to D4g are arranged so that, if their junction temperature is normal within, for example, 150° C., their forward voltage becomes not less than the threshold of the MOSFET Qs1. In this state, the power IC 1 is on. On the other hand, because the forward voltage of these diodes D4a to D4g has a negative temperature characteristic, if the junction temperature becomes abnormal, for example, not less than 150° C., the forward voltage becomes lower than the threshold of the MOSFET Qs1. In this state, the power IC 1 is turned off.

The latch circuit unit (a flip-flop) 3B of the power IC 1 is a circuit unit which holds the output data (the output signal) of the thermal sense circuit unit 3A, and includes an n-channel type of MOSFETs QL1 and QL2, resistors 7a and 7b, and an n-channel type of MOSFET Qs2.

The MOSFETs QL1 and QL2 and the resistors 7a and 7b are elements for latching data. The drain electrodes of the MOSFETs QL1 and QL2 are electrically connected to the (peripheral circuit-connected) first power source terminal 2G2 (finally, the gate terminal 2G) the resistors 7a and 7b, respectively. The gate electrode of the MOSFET QL1 is electrically connected to the drain electrode of the MOSFET QL2, and the gate electrode of the MOSFET QL2 is electrically connected to the MOSFET QL1. In addition, the source electrodes of the MOSFETs QL1 and QL2 are electrically connected to the (peripheral circuit-connected) second power source terminal 2S2 (finally, the source terminal 2S).

The MOSFET Qs2 is an element for inverting the output of the latch circuit unit 3B if the value detected by the thermal sense circuit unit 3A becomes not less than a predetermined value (a predetermined temperature). The drain electrode of the MOSFET Qs2 is electrically connected to the gate electrode of the MOSFET QL1, the gate electrode of the MOSFET Qs2 is electrically connected to the output of the thermal sense circuit unit 3A (i.e., the MOSFET QL2 is turned on earlier than the MOSFET QL1), and the source electrode of the MOSFET Qs2 is incorporated in the circuit in the state of being electrically connected to the (peripheral circuit-connected) second power source terminal 2S2 (finally, the source terminal 2S).

The gate cutoff circuit unit 3C of the power IC 1 is a circuit unit which cuts off the drain current of the power MOSFET Qp to turn off the power MOSFET Qp, if the value detected by the thermal sense circuit unit 3A becomes not less than the predetermined value (the predetermine temperature), and includes an n-channel type of MOSFET Qs3, a resistor R8 and a diode D5.

The drain electrode of the MOSFET Qs3 is electrically connected to a node E between the resistor R8 and the gate electrode of the power MOSFET Qp via the diode D5, the gate electrode of the MOSFET Qs3 is electrically connected to the output of the latch circuit unit 3B, and the source electrode of the MOSFET Qs3 is incorporated in the state of being electrically connected to the (peripheral circuit-connected) GND terminal 2S (i.e., the source terminal 2S).

The resistor R8 is an element for dropping the input voltage of the power MOSFET Qp if the detected value becomes not less than the predetermined temperature, and is electrically connected between power MOSFET gate terminal 2G1 and the gate electrode of the power MOSFET Qp. The diode D5 is an element for restraining a leak current from the source electrode to the gate electrode of the power MOSFET Qp.

The current limiting circuit unit 3D of the power IC 1 is a circuit unit which limits a drain current which flows to the power MOSFET Qp, and includes an n-channel type of MOSFET Qa, a sense circuit unit 3d1, an n-channel type of MOSFET Qs4 and a diode D6.

The MOSFET Qa is connected in parallel with the power MOSFET Qp. Specifically, the drain electrode of the MOSFET Qa is electrically connected to the drain terminal 2D, the gate electrode of the MOSFET Qa is electrically connected to power MOSFET gate terminal 2G1 (finally, the gate terminal 2G), and the source electrode of the MOSFET Qa is incorporated in the circuit in the state of being electrically connected to the (peripheral circuit-connected) second power source terminal 2S2 via the sense circuit unit 3d1.

The MOSFET Qa has the same structure as the power MOSFET Qp. However, the MOSFET Qa is formed to be smaller in size and quantity (the thickness of insulating film) than the power MOSFET Qp and to ensure that the MOSFET Qa and the power MOSFET Qp are in a predetermined ratio in size and quantity.

The drain electrode of the MOSFET Qs4 is electrically connected to a node F between the resistor R8 and the gate electrode of the power MOSFET Qp via the diode D6, the gate electrode of the MOSFET Qs4 is electrically connected to a node G between the source electrode of the MOSFET Qa and the sense circuit unit 3d1, and the source electrode of the MOSFET Qs4 is incorporated in the circuit in the state of being electrically connected to the (peripheral circuit-connected) second power source terminal 2S2.

The sense circuit unit 3d1 is made of, for example, diodes or resistors, and is a circuit unit which is electrically connected between the gate and the source of the MOSFET Qs4 and causes an on/off operation (switching operation) of the MOSFET Qs4 on the basis of a drain current which flows from the MOSFET Qa. The diode D6 is an element for restraining a leak current from the source electrode to the gate electrode of the power MOSFET Qp.

The circuit operation of the power IC 1 which is finished (in the state in which the power MOSFET gate terminal 2G1 and the (peripheral circuit-connected) first power source terminal 2G2 are electrically connected to each other, and the power MOSFET source terminal 2S1 and the (peripheral circuit-connected) second power source terminal 2S2 are electrically connected to each other) will be described below while separately referring to normal operation and protection operation.

The normal operation means an operation to be performed by the power IC 1 when the temperature of the power IC 1 during the operation thereof is normal, and the protection operation means an operation to be performed by the power IC 1 when, for example, a load short-circuits and a drain voltage is applied to the power IC 1 with a large current flowing through the power MOSFET Qp or when an ambient temperature abnormally rises and the temperature of the power IC 1 during the operation thereof reaches an abnormal state.

The normal operation is as follows. If an on signal is inputted to the gate terminal 2G, the MOSFET QL1 of the latch circuit unit 3B is turned on earlier than the MOSFET QL2 and the gate voltage of the MOSFET Qs3 of the gate cutoff circuit unit 3C goes to a low level. Thus, the MOSFET Qs3 is turned off, and the on signal itself is transmitted to the gate electrode of the power MOSFET Qp.

In this case, if the junction temperature of the diodes D4a to D4g for detecting temperature is normal within, for example, 150° C., the forward voltage of the diodes D4a to D4f of the thermal sense circuit unit 3A becomes not less than the threshold of the MOSFET Qs1 and the MOSFET Qs1 is turned on. Then, the gate electrode potential of the MOSFET Qs2 of the latch circuit unit 3B goes to a low level, and the MOSFET Qs2 remains off. Thus, the output of the latch circuit unit 3B is normally at a low level.

The protection operation is as follows. If an abnormal state occurs due to the above-described cause or the like, for example, the junction temperature of the diodes D4a to D4g for detecting temperature becomes not less than 150° C., the forward voltage of the diodes D4a to D4g lowers with a temperature rise because of its negative temperature characteristic.

In this case, if the forward voltage of the diodes D4a to D4f becomes less than the threshold of the MOSFET Qs1 of the thermal sense circuit unit 3A, the MOSFET Qs1 is turned off and the gate electrode potential of the MOSFET Qs2 of the latch circuit unit 3B goes to a high level.

When the MOSFET Qs2 is turned off in this manner, the output of the thermal sense circuit unit 3A is inverted to invert the gate electrode potential of the MOSFET QL1 to a low level, and the gate electrode potential of the MOSFET Qs3 of the gate cutoff circuit unit 3C goes to a high level.

When the MOSFET Qs3 is turned off in this manner, a voltage drop occurs due to the resistor R8 and the gate electrode of the power MOSFET Qp goes to a low level irrespective of an external input signal, thereby cutting off the drain current of the power MOSFET Qp.

Once the drain current is cut off, the latch circuit unit 3B continues to hold the cutoff state. Accordingly, even if the temperature falls, the cutoff state continues so long as the external input signal is not set to a low level and resetting is not caused.

In addition, the following operation is performed by the current limiting circuit unit 3D. If a drain current of the MOSFET Qa which has the same structure as the power MOSFET Qp flows to the source terminal 2S via the current limiting circuit unit 3D, a voltage drop occurs in the current limiting circuit unit 3D according to the amount of current which has flown therethrough, and the potential between the gate electrode and the source electrode of the MOSFET Qs4 varies. In this case, if the potential between the gate electrode and the source electrode is not greater than the threshold of the MOSFET Qs4, the MOSFET Qs4 is turned off, and the power MOSFET Qp performs the normal operation. On the other hand, if the potential between the gate electrode and the source electrode of the MOSFET Qs4 is not less than the threshold of the MOSFET Qs4 (i.e., if it is detected that an overcurrent is flowing in the MOSFET Qa (the power MOSFET Qp), the MOSFET Qs4 is turned on and limits a current which flows to the power MOSFET Qp.

FIG. 3 shows a plan view of the semiconductor chip of the power IC 1 which is obtained at this stage (after the previous step 101 and immediately before the screening step 102). Although a semiconductor wafer is not yet divided into semiconductor chips at this stage, only one semiconductor chip 4 is shown in FIG. 3 for the sake of simplicity of explanation.

The semiconductor chip 4 is formed in, for example, a square shape in plan view, and a power MOSFET area PA, a thermal sense circuit area TA, a gate cutoff circuit area GA, a control circuit area CA, the power MOSFET gate terminal 2G1, the (peripheral circuit-connected) first power source terminal 2G2, the power MOSFET source terminals 2S1, the (peripheral circuit-connected) second power source. terminals 2S2 and lines L1, L2, L3a, L3b and L4 are disposed on the principal surface of the semiconductor chip 4.

The power MOSFET area PA (a half-tone area of FIG. 3) occupies a greater part of the principal surface of the semiconductor chip 4. A plurality of power MOSFETs Qp of the above-described type are formed in the power MOSFET area PA. The vertical structure of each of the power MOSFETs Qp will be described later.

The half-tone area PA of FIG. 3 also includes a conductor film pattern for forming the power MOSFET source terminals 2S. This conductor film is, for example, approximately 3.5 μm thick and is made of, for example, aluminum (Al), an Al—Si alloy, Al—Cu alloy or an Al—Si—Cu alloy. As will be described later, the conductor film is electrically connected to the source electrode of the power MOSFETs Qp.

The surface of the conductor film and the upper surface of a semiconductor substrate 4s are covered with a surface protection film, and two openings 5a are formed in the surface protection film and a portion of the conductor film is exposed in each of the openings 5a. The respective exposed portions of the conductor film serve as the power MOSFET source terminals 2S1 (the source terminals 2S).

The reasons why the power MOSFET source terminals 2S1 (the source terminals 2S) are provided at two locations on one semiconductor chip 4 are, for example, that the resistances of the source terminals 2S can be reduced by increasing the number of bonding wires to be connected to the source terminals 2S, and that the breakdown voltages of the power MOSFETs Qp can be improved by restraining a current from concentrating at the source terminals 2S at the time of short circuit of a load.

In a first embodiment, each of the (peripheral circuit-connected) second power source terminals 2S2 (2S2a) is formed to traverse an approximately central portion of the corresponding one of the power MOSFET source terminals 2S1 and in the state of being electrically insulated from the corresponding one of the power MOSFET source terminals 2S1.

The reason why the (peripheral circuit-connected) second power source terminals 2S2a are formed to traverse the respective power MOSFET source terminals 2S1 is as follows. At this stage, each of the power MOSFET source terminals 2S1 is electrically insulated from the corresponding one of the (peripheral circuit-connected) second power source terminals 2S2a. Since they need to be electrically connected to each other after the screening step as will be described later, they can be readily connected to each other because they are disposed at locations comparatively close to each other.

As compared with the power MOSFET source terminals 2S1, each of the (peripheral circuit-connected) second power source terminals 2S2a is formed in a narrow strip-like pattern. This is because, as will be described later, no power MOSFETs Qp can be formed below the (peripheral circuit-connected) second power source terminals 2S2a, and if such pattern is made too wide, the number of power MOSFETs Qp decreases. Incidentally, the width of each of the (peripheral circuit-connected) second power source terminals 2S2a is, but not limited to, for example, approximately 20–50 µm.

The (peripheral circuit-connected) second power source terminal 2S2a are electrically connected, through the line L1, to the protection circuit 3 other than the power MOSFETs Qp (refer to FIG. 1) (i.e., the thermal sense circuit unit, the latch circuit unit, the gate cutoff circuit unit, the current limiting circuit unit and the like) and to a conductor film pattern for the (peripheral circuit-connected) second power source terminal 2S2b. The surface of the conductor film and the upper surface of the semiconductor substrate 4s are covered with the surface protection film, and a portion of the conductor film is exposed in an opening 5b formed in the surface protection film. The exposed area serves as the (peripheral circuit-connected) second power source terminal 2S2b.

The (peripheral circuit-connected) second power source terminal 2S2b is a terminal to which a predetermined voltage is to be supplied through a probe needle which is brought into contact with the terminal during the screening step and the probe screening step. For this reason, the (peripheral circuit-connected) second power source terminal 2S2b is formed to have a size with which the probe needle can be brought into contact, and is provided in an area other than the power MOSFET area PA, in which no problem occurs even if a pattern area is made comparatively large.

Specifically, the probe needle cannot be brought into contact with the (peripheral circuit-connected) second power source terminals 2S2a in the power MOSFET area PA, because neither of the areas of the (peripheral circuit-connected) second power source terminals 2S2a can be made very large for the above-described reason. However, so long as the probe needle is not brought into contact with the (peripheral circuit-connected) second power source terminals 2S2a, the predetermined voltage cannot be supplied during the required testing step. For this reason, the (peripheral circuit-connected) second power source terminal 2S2b which is electrically connected to the (peripheral circuit-connected) second power source terminals 2S2a and has a size with which the probe needle can be brought into contact is provided in the area other than the power MOSFET area PA in which no problem occurs even if a pattern area is made comparatively large. The predetermined voltage is supplied through the (peripheral circuit-connected) second power source terminal 2S2b.

The (peripheral circuit-connected) second power source terminals 2S2 (2S2a and 2S2b) are, for example, approximately 3.5 µm thick and are made of, for example, aluminum (Al), an Al—Si alloy, an Al—Cu alloy or an Al—Si—Cu alloy. The (peripheral circuit-connected) second power source terminals 2S2 are patterned from one conductor film at the same time as the power MOSFET source terminals 2S1, as by photolithography and dry etching techniques.

The thermal sense circuit area TA is disposed in the center of the power MOSFET area PA (i.e., the center of a conductor pattern for the source terminals 2S). The diodes D4a to D4g for detecting temperature are formed in the thermal sense circuit area TA, and the other elements for the thermal sense circuit are formed in the control circuit area CA. The elements for the thermal sense circuit in the thermal sense circuit area TA and the elements for the thermal sense circuit in the control circuit area CA are electrically connected through lines L2. In addition to the elements for the thermal sense circuit, elements for the latch circuit, elements for the current limiting circuit and the like are disposed in the control circuit area CA.

The reason why the thermal sense circuit area TA is disposed in the center of the power MOSFET area PA is that the sensitivity of temperature detection can be improved by disposing the thermal sense circuit area TA in the center of the power MOSFET area PA which shows a highest temperature during the operation of the power IC 1, whereby the power IC 1 can reliably perform the protection operation at an appropriate time.

On the principal surface of the semiconductor chip 2, conductor film patterns which respectively form the power MOSFET gate terminal 2G1 and the (peripheral circuit-connected) first power source terminal 2G2 are formed in an area other than the power MOSFET area PA (in the vicinity of the top left corner of the semiconductor chip 4 as viewed in FIG. 3) in the state of being close to and electrically insulated from each other.

The conductor film pattern for the power MOSFET gate terminal 2G1 is formed in, for example, a rectangular shape in plan view, and the conductor film pattern for the (peripheral circuit-connected) first power source terminal 2G2 is formed in, for example, a C-like shape in plane view so as to surround a portion of the power MOSFET gate terminal 2G1.

Each of these conductor films is, for example, approximately 3.5 µm thick and is made of, for example, aluminum (Al), an Al—Si alloy, an Al—Cu alloy or an Al—Si—Cu alloy. The conductor film patterns are patterned at the same time as the power MOSFET source terminals 2S1 and the (peripheral circuit-connected) second power source terminals 2S2, as by photolithography and dry etching techniques.

The surfaces of the conductor films and the upper surface of the semiconductor substrate 4s are covered with the surface protection film, and a portion of each of the conductor films is exposed in an opening 5c formed in the surface protection film. The exposed area of the conductor films serve as the power MOSFET gate terminal 2G1 and the (peripheral circuit-connected) first power source terminal 2G2, respectively. Specifically, the power MOSFET gate terminal 2G1 and the (peripheral circuit-connected) first power source terminal 2G2 are exposed in one opening 5b.

The reason why the power MOSFET gate terminal 2G1 and the (peripheral circuit-connected) first power source terminal 2G2 are disposed in proximity to each other in the above-described manner is as follows. At this stage, the power MOSFET gate terminal 2G1 and the (peripheral circuit-connected) first power source terminal 2G2 are electrically insulated from each other. Since they need to be electrically connected to each other after screening as will be described later, they can be readily connected to each other because they are disposed at locations comparatively close to each other.

The power MOSFET gate terminal 2G1 is electrically connected to the elements formed in the gate cutoff circuit area GA and to the gate electrodes of the power MOSFETs Qp formed in the power MOSFET area PA, through the lines L3a and L3b. The (peripheral circuit-connected) first power source terminal 2G2 is electrically connected to the elements formed in the control circuit area CA through the line L4.

An example of the vertical structure of each of the power MOSFETs Qp of the power IC 1 and other MOSFETs which is obtained at this stage (after the previous step 101 and immediately before the screening step 102) will be described below with reference to FIGS. 4 and 5 which are cross-sectional views showing an essential portion of the semiconductor chip 4. FIG. 4 is a cross-sectional view taken along line 4—4 of FIG. 3.

The semiconductor substrate 4s includes a semiconductor substrate 4s1 which is made of $n^+$ type single-crystal silicon (Si) having a resistivity of, for example, 0.004 Ω, and an epitaxial layer 4s2 which is, for example, 10 μm thick and is made of $n^-$ type single-crystal silicon (Si) having a resistivity of, for example, 0.8 Ω, and the epitaxial layer 4s2 is formed over the semiconductor substrate 4s 1.

A field insulating film 6 made of, for example, silicon oxide is selectively formed on the principal surface of the semiconductor substrate 4s (the epitaxial layer 4s2). The drain terminal 2D of the power MOSFETs Qp is formed on the reverse surface of the semiconductor substrate 4s (the semiconductor substrate 4s1). This drain terminal 2D is formed without being separated, by depositing a conductor film 7 on the entire reverse surface of the semiconductor substrate 4s.

The structure of each of the power MOSFETs Qp will be described below. Each individual power MOSFET Qp (the left sides of FIGS. 4 and 5) is formed with a vertical MOSFET structure. Its drain region is formed of the semiconductor substrate 4s1 and the epitaxial layer 4s2, and is shared by all the power MOSFETS Qp.

The channel region of the power MOSFET Qp is formed in p-type semiconductor regions 8c immediately below a gate electrode 8g of the power MOSFET Qp. These p-type semiconductor regions 8c are formed by incorporating, for example, boron which is a p-type impurity, and are formed at the opposite ends of the gate electrode 8g. The p-type semiconductor regions 8c are formed above the epitaxial layer 4s2 in such a manner that ends of the respective p-type semiconductor regions 8c overlap the corresponding end portions of the gate electrode 8g in plan view.

$P^+$-type semiconductor regions 8c1 are respectively formed above the p-type semiconductor regions 8c. The $p^+$-type semiconductor regions 8c1 are formed by incorporating, for example, boron which is a p-type impurity, with a higher concentration than the concentration of boron in the p-type semiconductor regions 8c.

The source region of the power MOSFET Qp is formed by $n^+$-type semiconductor regions 8s. Each of the $n^+$-type semiconductor regions 8s is formed by incorporating, for example, phosphorus or arsenic (As) which is an n-type impurity, and is formed above the p-type semiconductor region 8c in such a manner that one end of the $n^+$-type semiconductor region 8s is adjacent to the $p^+$-type semiconductor region 8c1 and the other end slightly overlaps the gate electrode 8g in plan view.

The gate electrode 8g of the power MOSFET Qp is made from, for example, a single film of low-resistance polysilicon or a stacked film in which a silicide film such as a tungsten silicide film is formed over a low-resistance polysilicon film. The gate electrode 8g is formed above a gate insulating film 8i on the principal surface of the semiconductor substrate 4s. The gate insulating film 8i is made of, for example, a silicon oxide film of approximately 500 Å thick, and its intrinsic withstand voltage is approximately 40 V.

One example of the structure of a MOSFET for the protection circuit, which is formed on the semiconductor chip 4, will be described below. A portion of the above-described gate cutoff circuit area GA is shown on the right side of each of FIGS. 4 and 5. A $p^-$-type semiconductor region (a first semiconductor region) 9 is formed above the epitaxial layer 4s2. The MOSFET Qs3 of the above-described gate cutoff circuit area GA is formed in the $p_-$-type semiconductor region 9.

The MOSFET Qs3 is formed with a lateral structure. Its drain region includes an $n^-$-type semiconductor region 10d1 and an $n^+$-type semiconductor region 10d2. The n-type semiconductor region 10d1 and the $n^+$-type semiconductor region 10d2 are formed by incorporating, for example, phosphorus or arsenic (As) which is an n-type impurity, and is formed above the epitaxial layer 4s2.

The $n^-$-type semiconductor region 10d1 is a region of low impurity concentration for moderating the concentration of an electric field at the drain region, and one end of the $n^-$-type semiconductor region 10d1 is formed to overlap a gate electrode 10g of the MOSFET Qs3 in plan view, and the other end overlaps and is electrically connected to the $n^+$-type semiconductor region 10d2.

The source electrode of the MOSFET Qs3 is formed of an $n^+$-type semiconductor region 10s. This $n^+$-type semiconductor region 10s is formed by incorporating, for example, phosphorus or As which is an n-type impurity, and is formed above the epitaxial layer 4s2 with the same depth as the above-described $n^+$-type semiconductor region 10d2.

One end of the $n^+$-type semiconductor region 10s is formed to overlap the gate electrode 10g in plan view, and the other end is formed in contact with a $p^+$-type semiconductor region 9a. This $p^+$-type semiconductor region 9a is formed by incorporating, for example, boron which is a p-type impurity, and is electrically connected to the $p^-$-type semiconductor region 9.

The channel region of the MOSFET Qs3 is formed between the $n^-$-type semiconductor region 10d1 and the $n^+$-type semiconductor region 10s and in an upper portion of the $p^-$-type semiconductor region 9 immediately below the gate electrode 10g.

The gate electrode 10g of the MOSFET Qs3 is made from, for example, a single film of low-resistance polysilicon or a stacked film in which a silicide film such as a tungsten silicide film is formed over a low-resistance polysilicon film. The gate electrode 10g is formed above a gate insulating film 10i on the principal surface of the semiconductor substrate 4s. The gate insulating film 10i is made of, for example, a silicon oxide film of approximately 500 Å thick, and its intrinsic withstand voltage is approximately 40 V. The gate electrode 10g is patterned at the same time as the above-described gate electrode 8g.

An interlayer insulating film 11a made of, for example, a silicon oxide film is formed on the principal surface of the semiconductor substrate 4s, and the gate electrodes 8g, 10g and the like are covered with the interlayer insulating film 11a. Formed on the principal surface of the interlayer insulating film 11a are a conductor film pattern 12s1 for the power MOSFET source terminal 2S1, a conductor film pattern 12s2 for the (peripheral circuit-connected) second power source terminal 2S2, a conductor film pattern 12g1 for a gate lead-out electrode, the conductor film pattern 12s2 for the source electrode, a conductor film pattern 12d for the drain electrode, and the like.

These conductor film patterns 12s1, 12s2, 12g1 and 12d are, for example, approximately 3.5 μm thick and are made of, for example, aluminum (Al) or an Al alloy such as an Al—Si—Cu alloy. The conductor film patterns 12s1, 12s2, 12g1 and 12d are patterned at the same time, as by photolithography and dry etching techniques.

The conductor film pattern 12s1 for the power MOSFET source terminal 2S1 is electrically connected to the $n^+$-type semiconductor regions 8s and the $p^+$-type semiconductor regions 8c1 of the power MOSFET Qp through connection holes 13a formed in the interlayer insulating film 11a. Thus, the power MOSFET source terminal 2S1 is electrically connected to the source region and the channel region of the power MOSFET Qp.

In the power MOSFET area PA, the conductor film pattern 12s2 for the (peripheral circuit-connected) second power source terminal 2S2 is formed above the field insulating film 6 with the interlayer insulating film 11a interposed therebetween. The reason why the conductor film pattern 12s2 is formed above the field insulating film 6 is, for example, as follows.

Specifically, the conductor film pattern 12s1 and the conductor film pattern 12s2 are connected by press-fitting bonding wires such a manner as to straddle to both of the patterns 12s1 and 12s2, as will be described later, but in this case, it is necessary to moderate damage caused to the semiconductor substrate 4s by the pressure applied to a portion immediately below the conductor film pattern 12s2. In addition, even if the conductor film pattern 12s2 is a comparatively narrow pattern, it is possible to prevent a defective connection between the conductor film pattern 12s1 and the conductor film pattern 12s2, by making the height of the top of the conductor film pattern 12s2 larger than that of the top of the conductor film pattern 12s1.

The conductor film pattern 12g1 for a gate lead-out electrode is electrically connected to the gate electrode 8g of the power MOSFET Qp through a connection hole 13b formed in the interlayer insulating film 11a. The conductor film pattern 12g1 is electrically connected to the power MOSFET gate terminal 2G1. Accordingly, the power MOSFET gate terminal 2G1 is electrically connected to the gate electrode 8g via the resistor R8.

The conductor film pattern 12s2 is electrically connected to the $n^+$-type semiconductor region 10s for the source of the MOSFET Qs3 and the $p^+$-type semiconductor region 9a for channel connection of the MOSFET Qs3, through a connection hole 13c. The conductor film pattern 12s2 is electrically connected to the (peripheral circuit-connected) second power source terminal 2S2. Accordingly, the (peripheral circuit-connected) second power source terminal 2S2 is electrically connected to the source and channel regions of the MOSFET Qs3.

The conductor film pattern 12d for the drain electrode is electrically connected to the $n^+$-type semiconductor region 10d2 for the drain of the MOSFET Qs3 through a connection hole 13d. The conductor film pattern 12d is also electrically connected to the power MOSFET gate terminal 2G1. Accordingly, the power MOSFET gate terminal 2G1 is electrically connected to the drain region of the MOSFET Qs3 via the resistor R8.

Reference numerals Qx1 and Qx2 denote parasitic bipolar transistors. The parasitic bipolar transistors Qx1 and Qx2 are electrically connected as shown by dashed lines in FIG. 6.

In the screening step which will be described later, a bias voltage is applied to the parasitic bipolar transistor Qx2 in a base-open state. It is, therefore, necessary to consider a withstand voltage VCEO of the parasitic bipolar transistor Qx2.

In the first embodiment, the impurity concentration of a semiconductor region (the $p^-$-type semiconductor region 9) in which the parasitic bipolar transistor Qx2 is formed is set lower than that of the p-type semiconductor region 8c of the power MOSFET Qp, so that the withstand voltage VCEO can be made sufficiently larger than the screening voltage, whereby it is possible to prevent the problem that a leak current flows in the thickness direction of the source terminal 2S.

The screening step and the probe screening step (testing steps) for the power IC 1 according to the first embodiment will be described below.

FIG. 7 shows an example of arrangement of probe needles 14a to 14d in the corresponding testing step. Specifically, the probe needle 14a is brought into contact with and electrically connected to the (peripheral circuit-connected) first power source terminal 2G2. The probe needle 14b is brought into contact with and electrically connected to the power MOSFET gate terminal 2G1. The probe needle 14c is brought into contact with and electrically connected to the power MOSFET source terminal 2S1. The probe needle 14d is brought into contact with and electrically connected to the (peripheral circuit-connected) second power source terminal 2S2b.

FIG. 8 shows the state of application of voltages to the individual terminals in each of the testing steps. First, in the screening step, the probe needle 14b is brought into contact with the power MOSFET gate terminal 2G1 and a gate voltage VG of, for example, approximately 30 V is applied to the terminal 2G1, and the probe needle 14c is brought into contact with the power MOSFET source terminal 2S1 and a voltage of GND potential is applied to the terminal 2S1. In addition, because the oxide film between the gate and the drain need to be screened, a voltage of GND potential is applied to a reverse surface stage (the reverse surface of the semiconductor chip 4, i.e., the drain terminal). The respective probe needles 14a and 14b are made open without being brought into contact with the (peripheral circuit-connected) first power source terminal 2G2 and the (peripheral circuit-connected) second power source terminal 2S2b.

In other words, a screening voltage is applied between the power MOSFET gate terminal 2G1 and the power MOSFET source terminal 2S1. During this time, no screening voltage is applied to the protection circuit 3 because in the first embodiment the protection circuit 3 is electrically isolated from the power MOSFET Qp.

Accordingly, during the screening step, a comparatively high voltage (for example, approximately 30 V) required for screening the power MOSFET Qp can be applied to the gate insulating film of the power MOSFET Qp without being limited by the protection circuit 3.

Thus, it is possible to reliably eliminate a power MOSFET Qp having a latent defect, and it is possible to finally provide a highly reliable power IC 1. In addition, since the screening voltage can be made high, it is possible to improve the acceleration of screening and, hence, shorten screening time.

Then, in the probe screening step, the probe needle 14b and 14a are respectively brought into contact with the power MOSFET gate terminal 2G1 and the (peripheral circuit-connected) first power source terminal 2G2 and a gate voltage VG of, for example, approximately 0–30 V is applied to each of the the terminals 2G1 and 2G2, and the probe needles 14c and 14d are respectively brought into contact with the power MOSFET source terminal 2S1 and the (peripheral circuit-connected) second power source terminal 2S2b and a voltage of GND potential is applied to each of the terminals 2S1 and 2S2b. In addition, a drain voltage VD of, for example, approximately 0–70 V is applied to the reverse surface stage (the reverse surface of the semiconductor chip 4, i.e., the drain terminal).

In other words, a testing voltage for the probe screening step is applied between the gate terminal 2G and the source terminal 2S of the power IC 1. In this case, in the first embodiment, it is possible to execute the probe screening step merely by changing the manner of connection between the probe needles 14a to 14d and the terminals or voltages to be applied to the terminals, without the need to add a special new arrangement to or make alterations to the circuit in the probe screening step, just because the power MOSFETs Qp and the protection circuit 3 are electrically isolated from each other.

The die bonding step and the wire bonding step for the power IC 1 according to the first embodiment will be described below.

FIG. 9 shows the semiconductor chip 4 which is obtained after the die bonding step and the wire bonding step. For the sake of simplicity of explanation, FIG. 9 shows only a leadframe 15 for one semiconductor chip 4. Incidentally, the leadframe 15 is made of, for example, Cu.

In the die bonding step, a non-defective chip which has been chosen in the above-described screening and probe screening steps is cut out from the semiconductor wafer, and the non-defective chip is bonded to a chip mounting area 15a of the leadframe 15 by solder. A portion of the chip mounting area 15a is formed integrally with a lead 15LD. Specifically, the drain terminal on the reverse surface of the semiconductor chip 4 has a structure which is electrically connected to the chip mounting area 15a and is further led out by the lead 15LD.

Then, in the wire bonding step, the gate terminal 2G of the semiconductor chip 4 and a lead (a first lead) 15LG of the leadframe 15 are electrically connected to each other by a bonding wire 16a. Thus, the gate terminal 2G of the power IC 1 can be led out from the lead 15LG.

The source terminals 2S of the semiconductor chip 4 and a lead (a second lead) 15LS of the leadframe 15 are electrically connected to each other by two bonding wires 16b. Thus, the two source terminals 2S of the power IC 1 can be led out from one lead 15LS.

The bonding wires 16a and 16b are made from, for example, an Al wire of 500 μm in diameter. However, the material of the bonding wires 16a and 16b is not limited to Al, and various materials, for example, Au or Cu, may be used.

FIG. 10 is an enlarged plan view showing portions to which the bonding wires shown in FIG. 9 are connected, and FIG. 11 is a cross-sectional view taken along line 11—11 of FIG. 10. In the first embodiment, in the wire bonding step, the power MOSFET gate terminal 2G1 and the (peripheral circuit-connected) first power source terminal 2G2 are connected to each other, and the power MOSFET source terminals 2S1 and the corresponding (peripheral circuit-connected) second power source terminals 2S2 are connected to each other.

Specifically, one end of the bonding wire 16a is bonded to both the power MOSFET gate terminal 2G1 and the (peripheral circuit-connected) first power source terminal 2G2 which is coupled to a portion of the protection circuit 3, (in such a manner as to straddle the terminals 2G1 and 2G2), whereby the power MOSFET gate terminal 2G1 and the (peripheral circuit-connected) first power source terminal 2G2 are electrically connected to each other to form the gate terminal 2G of the power IC 1. The other end of the bonding wire 16a is connected (bonded) to the lead 15LG of the power IC 1. One end of each of the bonding wires 16b is bonded to both the corresponding one of the power MOSFET source terminals 2S1 and the corresponding one of the (peripheral circuit-connected) second power source terminals 2S2 in such a manner as to straddle both the corresponding terminals 2S1 and 2S2, whereby each of the power MOSFET source terminals 2S1 is electrically connected to the corresponding one of the (peripheral circuit-connected) second power source terminals 2S2 to form the source terminals 2S of the power IC 1. The other ends of the bonding wires 16b are connected (bonded) to the lead 15LS of the power IC 1. Thus, the power MOSFET Qp and the protection circuit 3 are integrally electrically connected to each other.

During the wire bonding step, since the (peripheral circuit-connected) first power source terminal 2G2a is formed above the field insulating film 6 as described previously, it is possible to moderate damage during the bonding of the bonding wires. In addition, the height of the top of the (peripheral circuit-connected) first power source terminal 2G2a becomes larger than the height of the top of the power MOSFET gate terminal 2G1, so that a defective connection between the power MOSFET gate terminal 2G1 and the (peripheral circuit-connected) first power source terminal 2G2a can be prevented.

As described above, in the first embodiment, during the wire bonding step which has heretofore been carried out, the power MOSFET gate terminal 2G1 and the (peripheral circuit-connected) first power source terminal 2G2 are connected to each other, and each of the power MOSFET source terminals 2S1 is connected to the corresponding one of the (peripheral circuit-connected) second power source terminals 2S2, but the number of manufacturing steps does not increase. In addition, it is not necessary to alter connection techniques for bonding wires or introduce new assembly techniques for the purpose of connecting the power MOSFET gate terminal 2G1 and the (peripheral circuit-connected) first power source terminal 2G2 and connecting each of the power MOSFET source terminals 2S1 and the corresponding one of the (peripheral circuit-connected) second power source terminals 2S2. Accordingly, the manufacturing cost of the power IC 1 does not increase.

The molding step and the assembled product screening step for the power IC 1 according to the first embodiment will be described below.

First, a leadframe on which a plurality of semiconductor chips are mounted are set in a resin-encapsulation mold. Then, the individual semiconductor chips are molded with an encapsulating resin, and the encapsulated power ICs 1 are separated into individual power ICs 1, whereby a power IC having the structure of a package 17 shown in FIG. 12 is assembled.

The package 17 is made of, for example, an epoxy-base resin, and the leads 15LG, 15LD and 15LS project vertically downward from the lower surface of the package 17. A portion of the leadframe 15 projects from the opposite surface to the lower surface of the package 17. This projecting portion has a heat radiating function and the like, and a through-hole is formed in the projecting portion in the thickness direction thereof.

In the next assembled product screening step, the packaged power ICs 1 are subjected to visual inspection and electrical characteristic inspection, and non-defective products are separated from defective products by screening and the product manufacturing process is completed. Incidentally, in the electrical characteristic inspection after the assembling step, a voltage to be applied is limited by the protection circuit 3 and a high voltage cannot be applied to only the gate insulating film of the power MOSFET Qp.

FIG. 13 shows the relation between gate voltage and gate breakdown occurrence frequency in the first embodiment. FIG. 14 shows the relation between gate voltage and gate breakdown occurrence frequency in a normal power IC examined by the present inventors.

Each of FIGS. 13(*a*) and 14(*a*) shows the relation between the gate voltage and the gate breakdown occurrence frequency after the previous step and before the screening step. Each waveform represents the distribution of occurrence of gate breakdowns with respect to the gate voltage.

FIG. 13(*b*) shows the relation between the gate voltage and the gate breakdown occurrence frequency after the screening step. In the relation shown in FIG. 13(*b*), since a screening voltage not less than the withstand voltage of the protection circuit can be applied, it is possible to eliminate products having latent defects. In the relation shown in FIG. 14(*b*), it is apparent that since a protection circuit is connected, a screening voltage not less than the withstand voltage of the protection circuit cannot be applied, so that products having latent defects cannot be completely eliminated.

FIG. 13(*c*) shows the relation between the gate voltage and the gate breakdown occurrence frequency after the wire bonding step. The waveform shown in FIG. 13(*c*) represents the voltage characteristic of the protection circuit.

FIG. 13(*d*) shows the relation between the gate voltage and the gate breakdown occurrence frequency when a surge voltage is applied to the gate electrode. According to the first embodiment, during screening, it is possible to apply a voltage not less than the withstand voltage of the protection circuit during screening, and, at the same time, it is possible to reliably eliminate power ICs having latent defects. Accordingly, at this stage, even if a surge voltage is applied, a gate breakdown hardly occurs.

In contrast, in the relation shown in FIG. 14(*c*), during screening, it is impossible to apply a voltage not less than the withstand voltage of the protection circuit, and it is impossible to reliably eliminate power ICs having latent defects. At this stage, if a surge voltage is applied, a gate breakdown may occur.

As described above, according to the first embodiment, it is possible to obtain the following effects.

(1) During the screening step, a comparatively high voltage which is necessary for screening of the power MOSFETs Qp can be applied to the gate insulating films of the power MOSFETs Qp without being limited by the protection circuit 3.

(2) According to the above effect (1), since it is possible to reliably eliminate power MOSFETs Qp having latent defects, it is possible to finally provide a highly reliable power IC 1.

(3) According to the above effect (1), since the screening voltage can be made high, it is possible to improve the acceleration of screening and, hence, shorten screening time.

(4) During the wire bonding step which has heretofore been carried out, the power MOSFET gate terminal 2G1 and the (peripheral circuit-connected) first power source terminal 2G2 are connected to each other, and each of the power MOSFET source terminals 2S1 is connected to the corresponding one of the (peripheral circuit-connected) second power source terminals 2S2. Accordingly, it is possible to manufacture highly reliable power ICs without altering or increasing manufacturing steps nor introducing new assembly techniques.

(5) According to the above effect (4), it is possible to manufacture highly reliable power ICs without incurring a great increase in manufacturing cost.

(6) The power MOSFET gate terminal 2G1 and the (peripheral circuit-connected) first power source terminal 2G2 are connected by a bonding wire having a high degree of freedom of connection, and the respective power MOSFET source terminals 2S1 and the (peripheral circuit-connected) second power source terminals 2S2 are connected by bonding wires having a high degree of freedom of connection. Accordingly, it is possible to easily provide connection between the terminals 2G1 and 2G2 as well as between the terminals 2S1 and 2S2.

(7) Since the (peripheral circuit-connected) second power source terminals 2S2*a* are provided above the field insulating film 6, it is possible to moderate damage during bonding of bonding wires in the wire bonding step.

(8) Since the (peripheral circuit-connected) second power source terminals 2S2*a* are provided above the field insulating film 6, the height of the top of the (peripheral circuit-connected) second power source terminal 2S2*a* can be made larger than the height of the top of the power MOSFET source terminal 2S1, so that a defective connection between the power MOSFET source terminal 2S1 and the (peripheral circuit-connected) second power source terminal 2S2*a* can be prevented.

Second Embodiment

Figure 15:
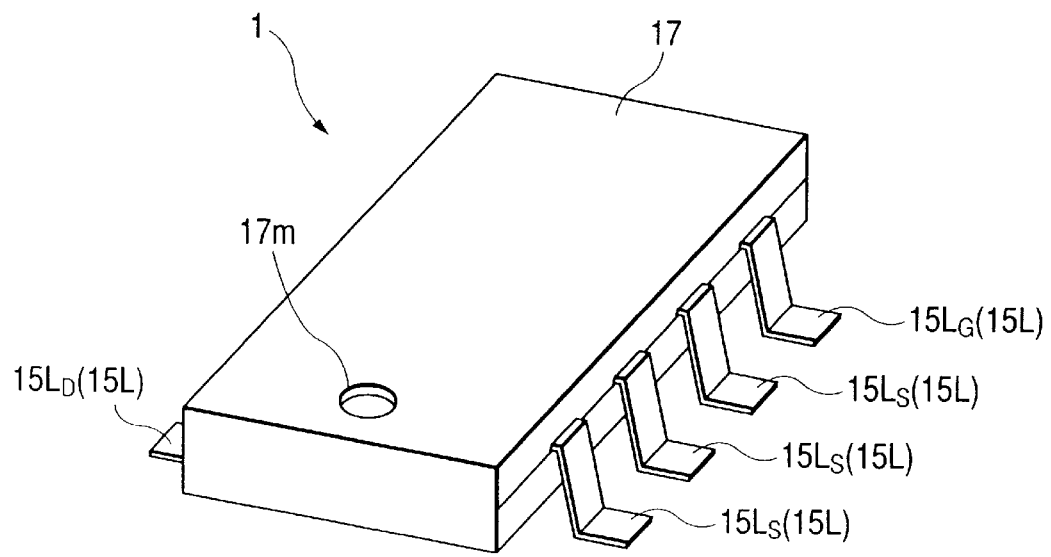
FIG. 15 is a perspective view of the whole of a semiconductor integrated circuit device according to another embodiment of the present invention.
Figure 13A:
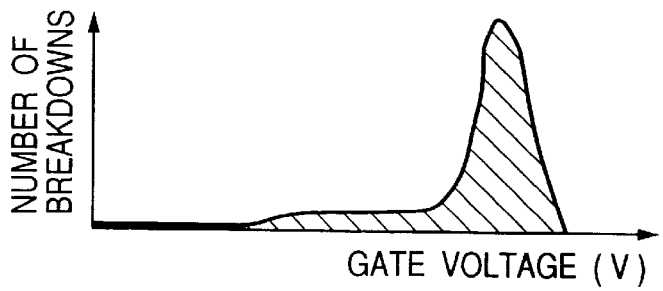
FIGS. 13(a) to 13(d) are explanatory views aiding in explaining the relation between gate voltage and gate breakdown occurrence frequency in the semiconductor integrated circuit device shown in FIG. 12.
Figure 13B:
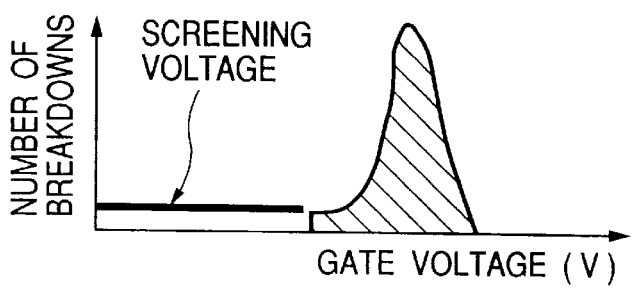
Figure 13C:
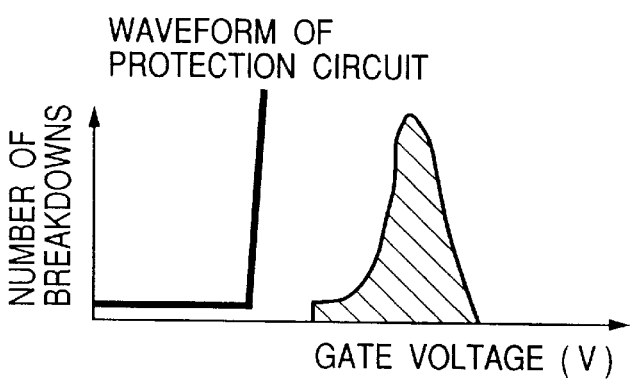
Figure 13D:
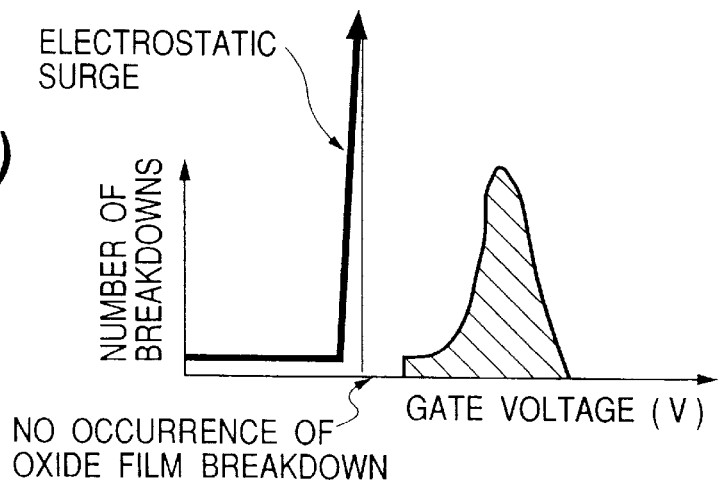
Figure 14A:
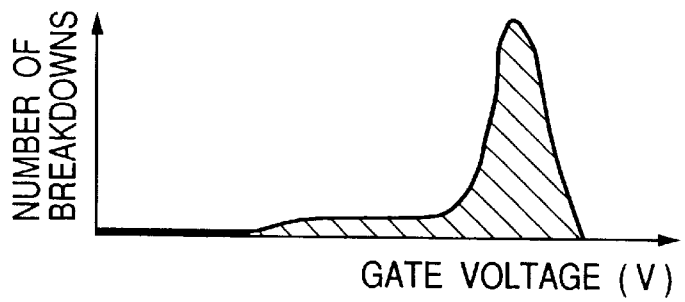
Figure 14B:
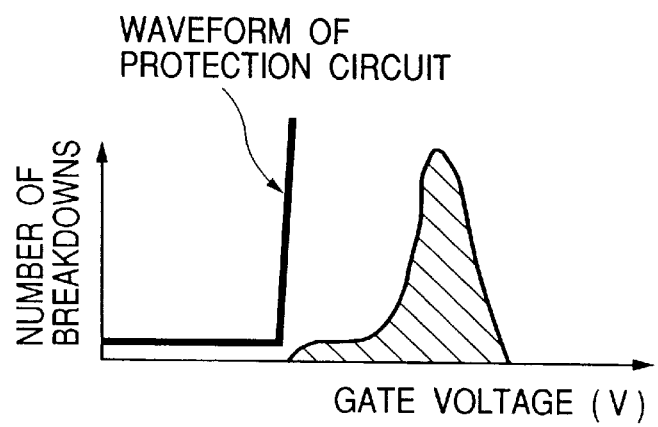
Figure 14C:
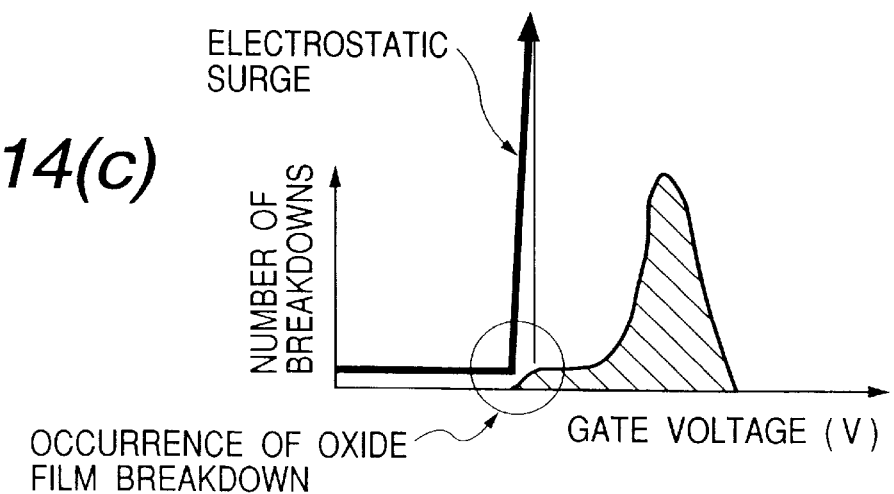
Figure 17:
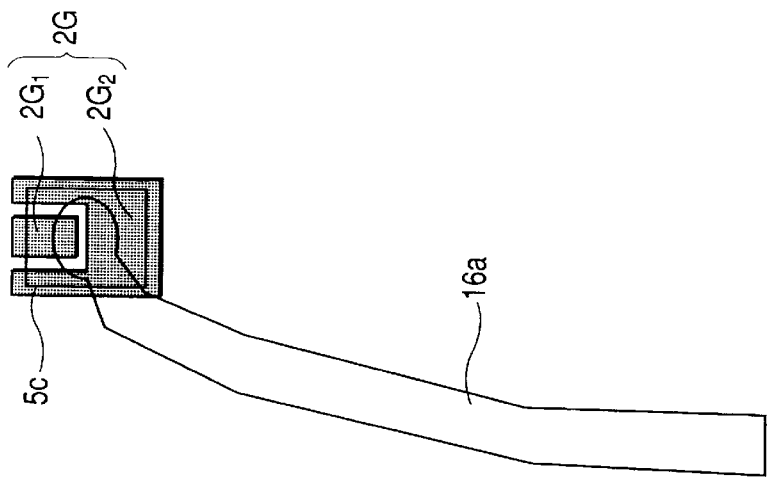
FIG. 17 is an enlarged plan view of an essential portion of the connection between bonding wires and terminals in the portion shown in FIG. 16.
Figure 16:
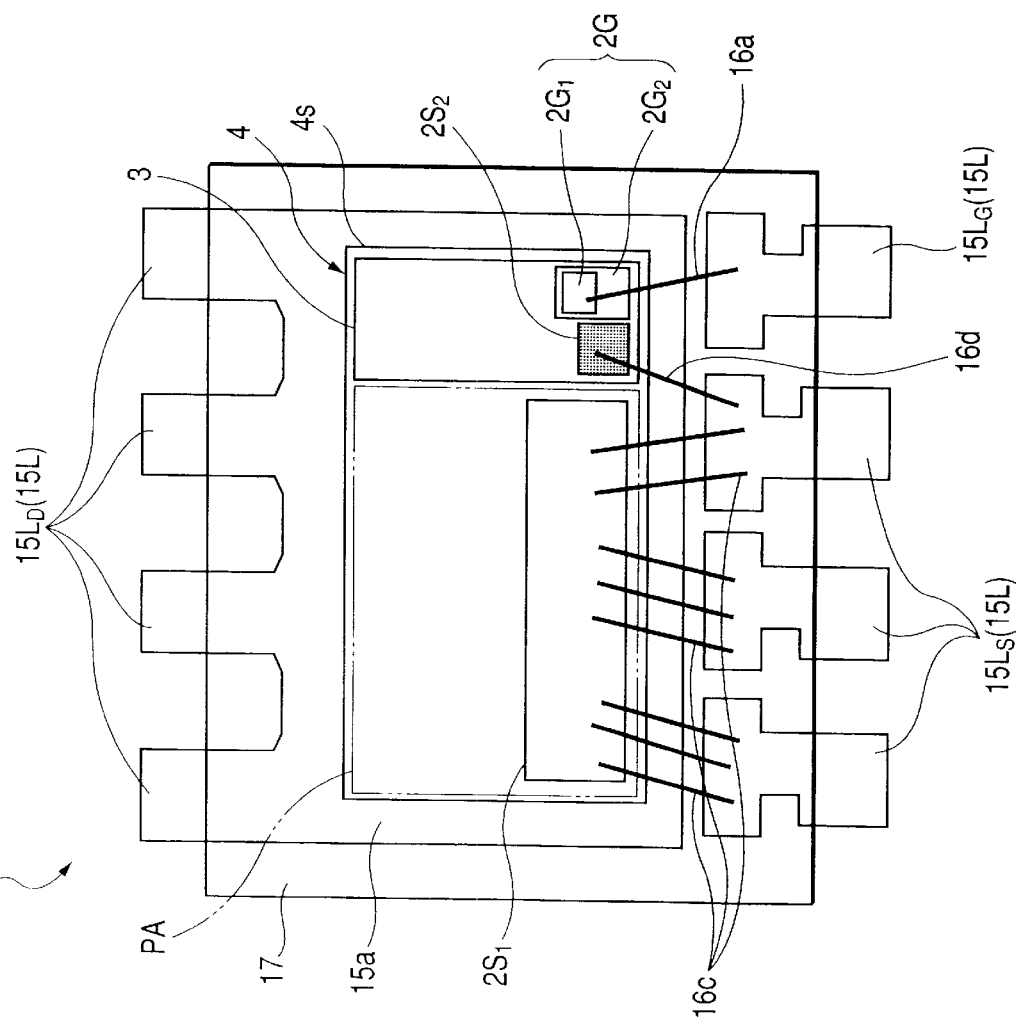
FIG. 16 is an explanatory view aiding in explaining the relation in connection between a semiconductor chip and package leads in the semiconductor integrated circuit device shown in FIG. 15.

FIG. 15 is a perspective view of the whole of a semiconductor integrated circuit device according to another embodiment of the present invention, FIG. 16 is an explanatory view aiding in explaining the relation in connection between a semiconductor chip and package leads of the semiconductor integrated circuit device shown in FIG. 15, and FIG. 17 is an enlarged plan view of an essential portion of the connection between bonding wires and terminals in FIG. 16.

FIG. 15 is a perspective view of the whole of a power IC 1 according to a second embodiment. In the second embodiment, the power IC 1 has, for example, an SOP (Small Outline Package) type of package structure.

The package 17 is made of, for example, an epoxy-base resin, and a mark 17 *m* which indicates a direction to mount the package 17 on a printed wiring board is formed on its top surface. Four leads 15L are projected from each side surface of the package 17. These leads 15L includes one lead 15LG for the gates of the power IC 1, three leads 15LS for the sources of the power IC 1, and four leads 15LD for the drains of the power IC 1.

FIG. 16 shows the interior of the package 17 of the semiconductor integrated circuit device shown in FIG. 15. FIG. 17 shows an enlarged plan view of an essential portion of the interior.

The four leads 15LD are formed integrally with the chip mounting area 15a, whereby the leads 15LD are electrically connected to one another and each of the leads 15LD is electrically connected to the chip mounting area 15a.

The semiconductor chip 4 is mounted on the chip mounting area 15a with its reverse surface bonded to the chip mounting area 15a, whereby the drain terminal on the reverse surface of the semiconductor chip 4 is electrically connected to the leads 15LD.

A power IC circuit similar to the above-described first embodiment is formed on the semiconductor chip 4. The power MOSFET gate terminal 2G1 and the (peripheral circuit-connected) first power source terminal 2G2 are disposed at adjacent locations in the state of being insulated from each other, as in the first embodiment. Incidentally, the state of connection of each of the power MOSFET gate terminal 2G1 and the (peripheral circuit-connected) first power source terminal 2G2 in the power IC circuit is the same as that described above in connection with the first embodiment.

The power MOSFET gate terminal 2G1 and the (peripheral circuit-connected) first power source terminal 2G2 are subjected to a screening step similar to that carried out in the first embodiment, and are then electrically connected to each other by the bonding wire 16a on the semiconductor chip 4, thereby forming one gate terminal 2G. The gate terminal 2G is electrically connected to the lead (a first lead) 15LG through the bonding wire 16a.

In the second embodiment, the power MOSFET source terminal 2S1 and the (peripheral circuit-connected) second power source terminal 2S2 are disposed on the principal surface of the semiconductor chip 4 at distant locations in the state of being insulated from each other. Incidentally, the state of connection of each of the power MOSFET source terminal 2S1 and the (peripheral circuit-connected) second power source terminal 2S2 in the power IC circuit is the same as that described above in connection with the first embodiment.

The power MOSFET source terminal 2S1 and the (peripheral circuit-connected) second power source terminal 2S2 which are separated from each other on the semiconductor chip 4 are subjected to a screening step similar to that carried out in the first embodiment, and, then, bonding wires 16c connected to the power MOSFET source terminal 2S1 and a bonding wire 16d connected to the (peripheral circuit-connected) second power source terminal 2S2 are connected to one lead (a second lead) 15LS, whereby the power MOSFET source terminal 2S1 and the (peripheral circuit-connected) second power source terminal 2S2 are electrically connected to each other.

Specifically, in the second embodiment, the power MOSFET source terminal 2S1 and the (peripheral circuit-connected) second power source terminal 2S2 are electrically connected to each other not on the semiconductor chip 4 but on the one lead 15LS.

Incidentally, the power MOSFET-connected gate terminal 2G1 and the (peripheral circuit-connected) first power source terminal 2G2 may also be electrically connected to each other on the lead 15LG by leading out the respective terminals 2G1 and 2G2 by means of different bonding wires and bonding the different bonding wires to the one lead 15LG.

In the second embodiment as well, it is possible to obtain the effects (1) to (5) obtained in the previously-described first embodiment.

Third Embodiment

Figure 18:
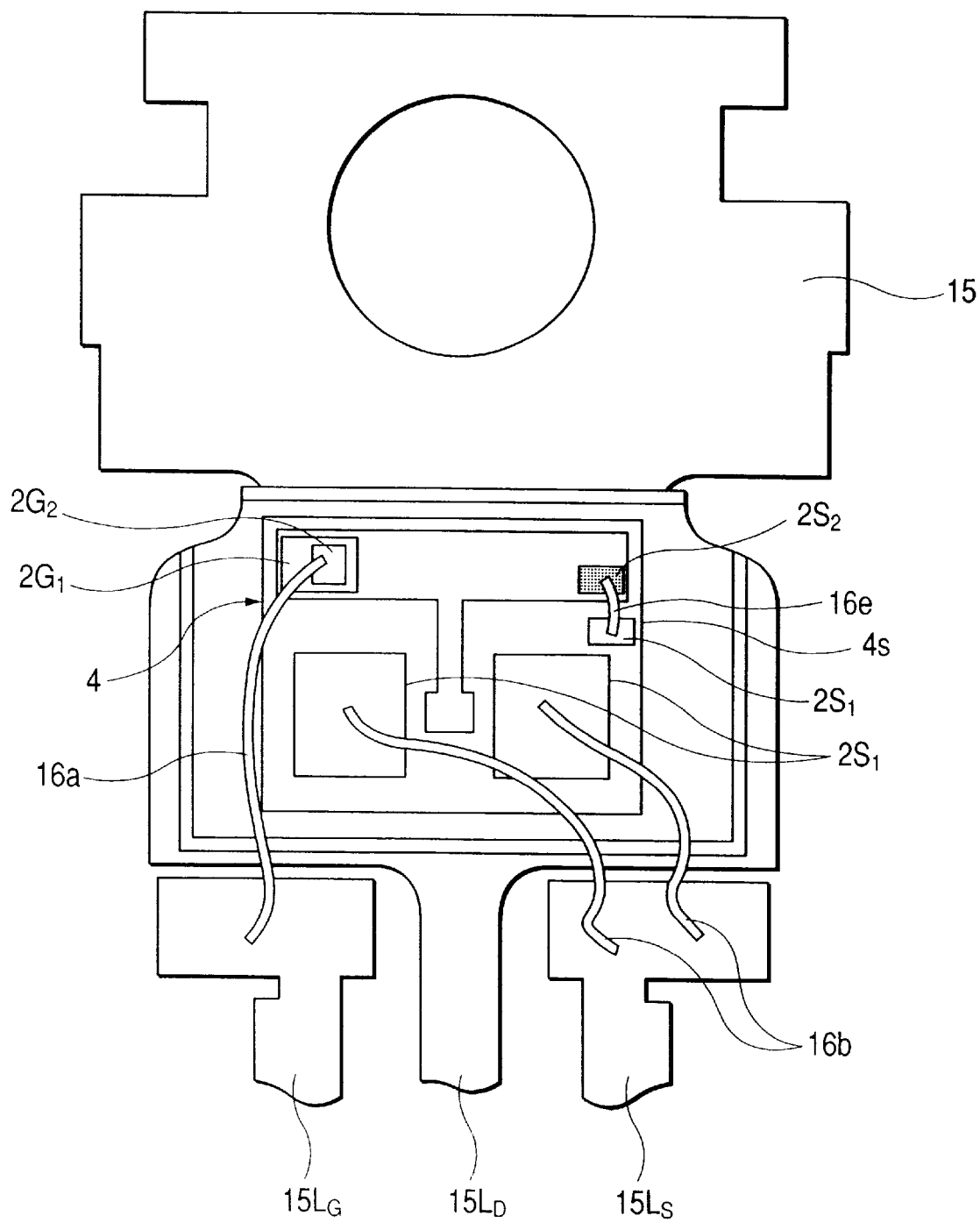
FIG. 18 is an explanatory view of a semiconductor integrated circuit device according to another embodiment of the present invention.

FIG. 18 is an explanatory view of a semiconductor integrated circuit device according to another embodiment of the present invention.

In a third embodiment, as shown in FIG. 18, the power MOSFET source terminals 2S1 and the (peripheral circuit-connected) second power source terminal 2S2 are formed on the principal surface of the semiconductor chip 4 at distant locations in the state of being insulated from each other, and are electrically connected to each other by a jumper wire 16e on the principal surface of the semiconductor chip 4. The other portion is identical to that of the first embodiment.

The jumper wire 16e is made from, for example, an Al wire of 125–500 μm in diameter. As in the first embodiment, after the screening step, the jumper wire 16e is bonded during the wire bonding step, i.e., at the same that the bonding wires 16a and 16b are bonded. The material of the bonding wires 16a and 16b is not limited to Al, and various materials, for example, Au or Cu, may be used.

In the third embodiment as well, it is possible to obtain the effects (1) to (5) obtained in the previously-described first embodiment.

Fourth Embodiment

Figure 19:
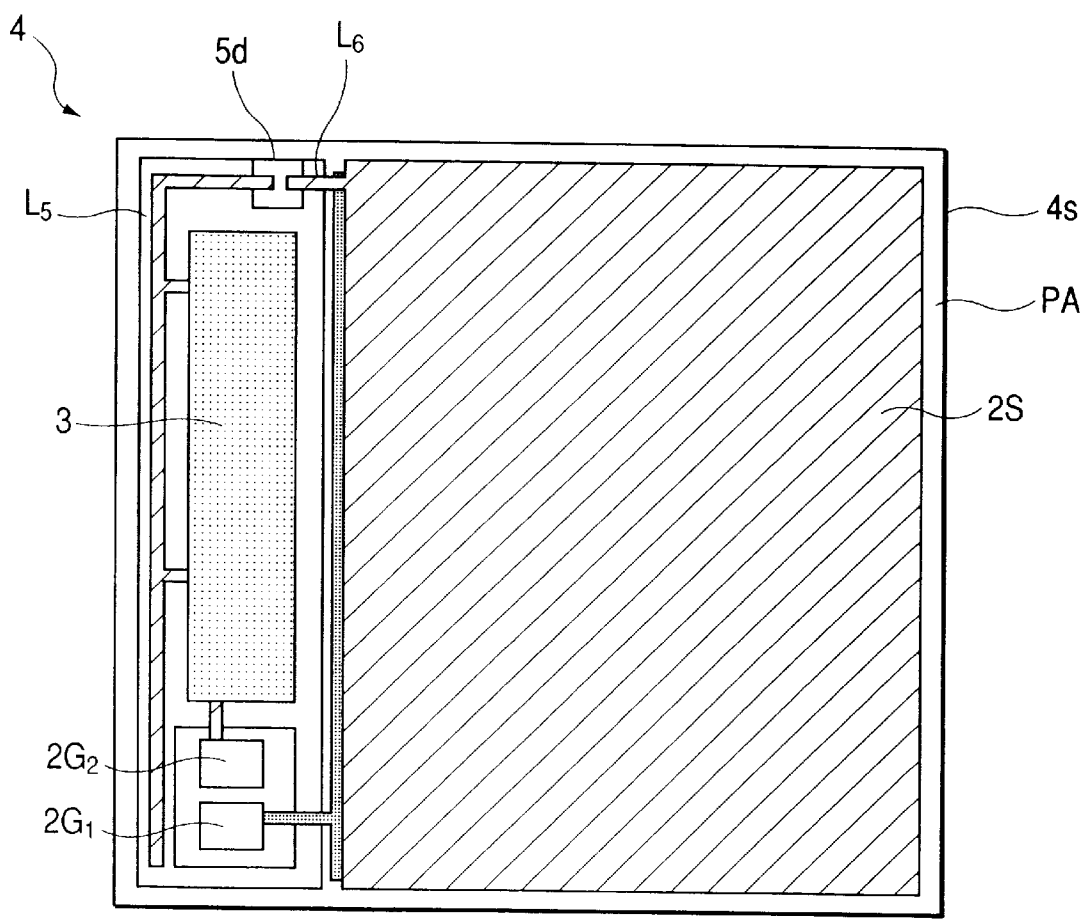
FIG. 19 is a plan view of a semiconductor chip which is obtained at an intermediate step in the process of manufacturing a semiconductor integrated circuit device according to another embodiment of the present invention.
Figure 20:
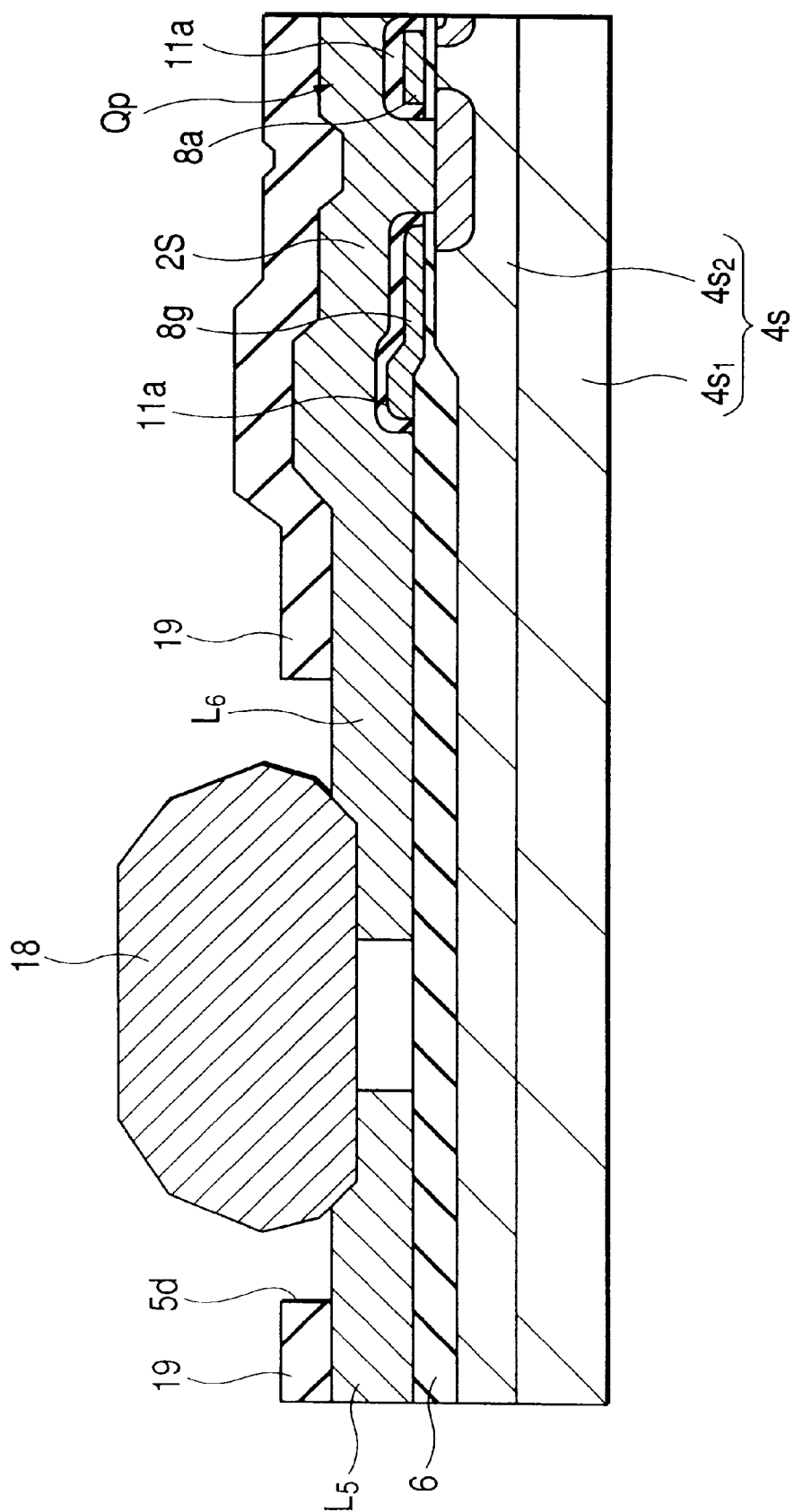
FIG. 20 is an enlarged cross-sectional view of an essential portion of the semiconductor chip which is obtained at an intermediate step in the process of manufacturing the semiconductor integrated circuit device.

FIG. 19 is a plan view of a semiconductor chip which is being manufactured in the process of manufacturing a semiconductor integrated circuit device according to another embodiment of the present invention. FIG. 20 is a fragmentary enlarged cross-sectional view of the semiconductor chip which is being manufactured in the process of manufacturing the semiconductor integrated circuit device.

A fourth embodiment is basically identical to the above-described first embodiment. The difference between the fourth and the first embodiments is the following arrangement.

FIG. 19 is a plan view of the semiconductor chip 4 of the power IC 1 before the screening step. At this stage, as in the first embodiment, a lead L5 for grounding the protection circuit 3 and the source terminal 2S are not electrically connected to each other, and the protection circuit 3 is not incorporated in the circuit of the power IC 1.

Specifically, an end of the lead L5 for grounding the protection circuit 3 and an end of a lead L6 connected to the source terminal 2S are disposed in proximity to each other in the state of being insulated from each other, in an area other than the power MOSFET area PA. The ends of both leads L5 and L6 are exposed in one opening 5d formed in a surface protection film.

In the screening step, as in the first embodiment, a screening voltage is applied between the power MOSFET gate terminal 2G1 and the source terminal 2S. Accordingly, a comparatively high screening voltage can be applied without being limited by the protection circuit 3, whereby it is possible to reliably eliminate power ICs having latent defects and provide highly reliable power ICs.

After screening, the leads L5 and L6 are connected by using a bonding ball (a conductor bump) 18, as shown in FIG. 20. This bonding ball 18 is made of, for example, Au. A method of forming the bonding ball 18 is, for example, as follows.

In the wire bonding step, after an end of a bonding wire made of, for example, an Au wire of approximately 50 μm in diameter is bonded between the opposed ends of the leads L5 and L6, the bonding wire is cut to leave only a ball-shaped bonded portion of the end of the bonding wire, thereby forming the bonding ball 18.

The reason why such Au wire is selected is that an Au wire can be made thinner than an Al wire and is suitable for use in connecting the leads L5 and L6 and the correction resistance between the leads L5 and L6 need not be increased.

The bonded portion of the bonding ball 18 is located above the field insulating film 6 of the semiconductor substrate 4s. This is intended to prevent the semiconductor substrate 4s from being damaged when the bonding ball 18 is bonded. In FIG. 20, reference numeral 19 denotes a surface protection film.

In the fourth embodiment as well, it is possible to obtain the following effect in addition to the effects (1) to (5) obtained in the previously-described first embodiment.

Since it is not necessary to form the lead L5 for grounding the protection circuit 3 in the area of the power MOSFET source terminal 2S, it is possible to decrease an on resistance without sacrificing the number of power MOSFET elements.

Fifth Embodiment

Figure 21:
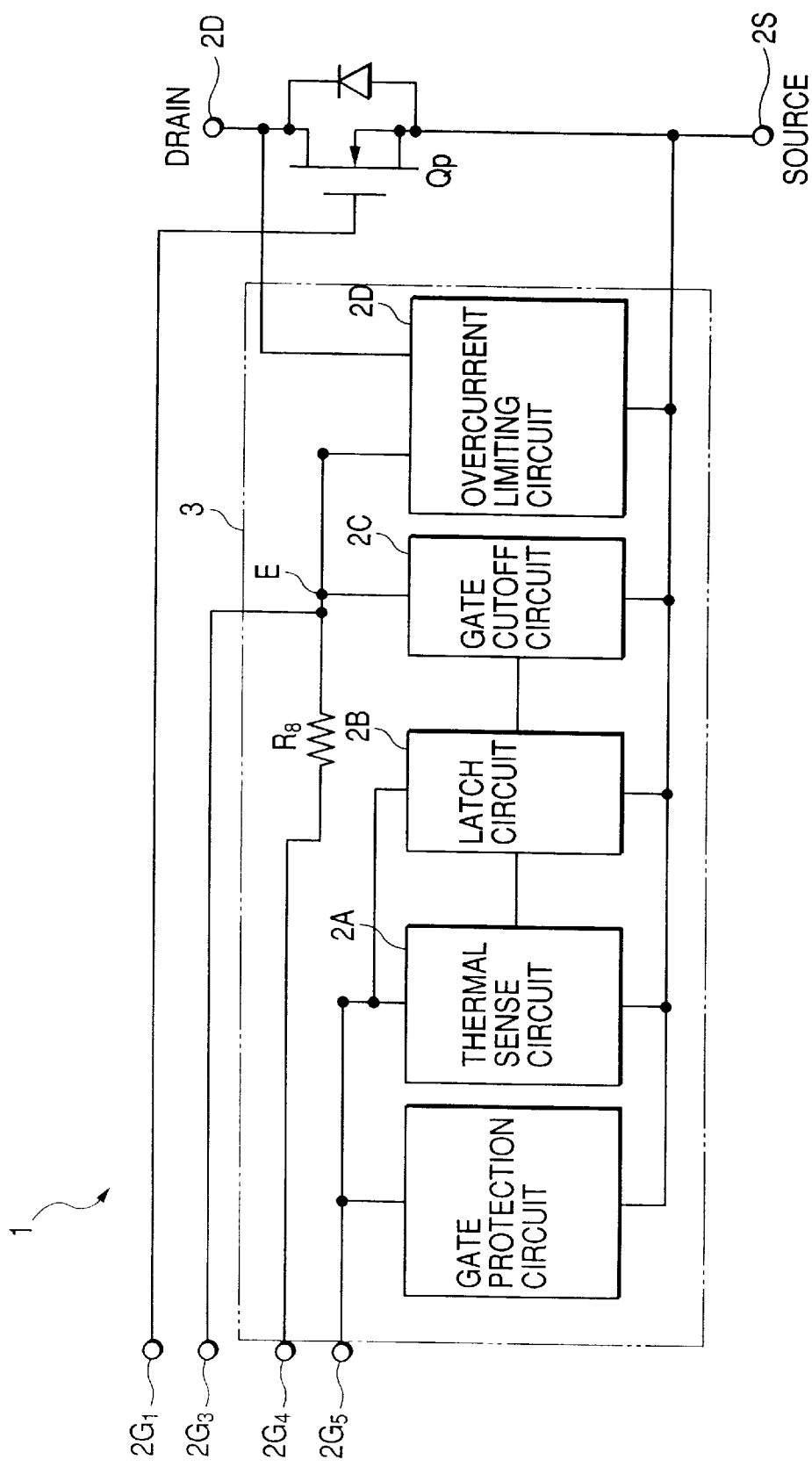
FIG. 21 is a diagram of an equivalent circuit which is obtained at an intermediately stage in the process of manufacturing a semiconductor integrated circuit device according to another embodiment of the present invention.
Figure 22:
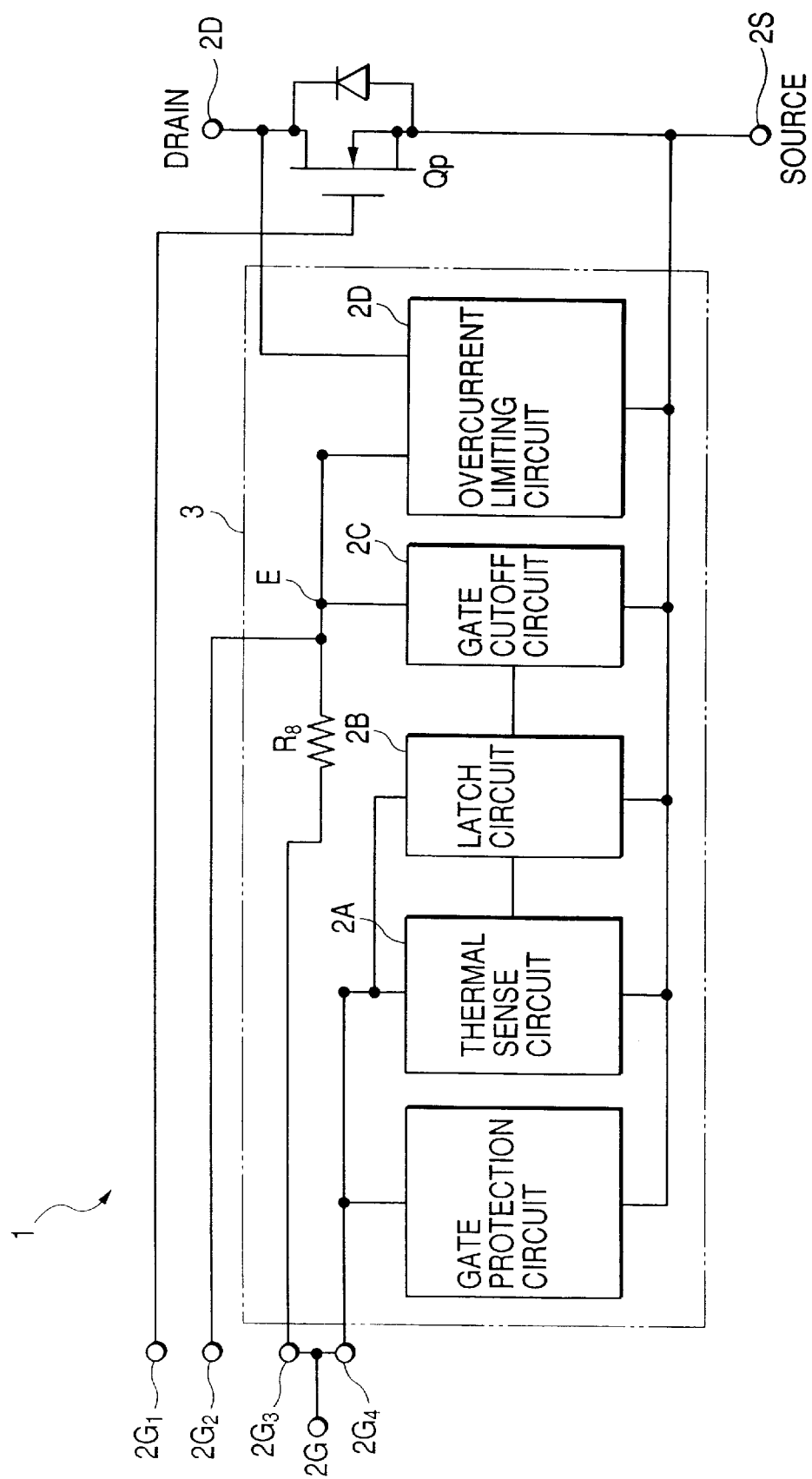
FIG. 22 is a diagram of an equivalent circuit of the semiconductor integrated circuit device shown in FIG. 21 after an assembly step.

FIG. 21 is a diagram of an equivalent circuit which is obtained in the process of manufacturing a semiconductor integrated circuit device according to another embodiment of the present invention, and FIG. 22 is a diagram of an equivalent circuit which is obtained after the step of assembling the semiconductor integrated circuit device.

FIG. 21 shows the equivalent circuit of the power IC 1 before the screening step. In a fifth embodiment, the source terminal of the power MOSFET Qp and the source terminal of the protection circuit 3 are formed as a common source terminal. In other words, at this stage, the source terminal of the power MOSFET Qp and the source terminal of the protection circuit 3 are not separated from each other.

In this structure, peripheral circuit-connected power source terminals 2G1, 2G3, 2G4 and 2G5 are provided on a semiconductor chip. The power MOSFET gate terminal 2G1 is a terminal for applying a screening voltage to the gate electrode of the power MOSFET Qp during the screening step, and is electrically connected to the gate electrode of the power MOSFET Qp.

However, neither the gate cutoff circuit unit 3C nor the current limiting circuit unit 3D is electrically connected to the power MOSFET gate terminal 2G1. In the fifth embodiment, the source terminal 2S is shared by the power MOSFET Qp and the protection circuit 3, and if a high screening voltage is applied between the inspection gate terminal 2G1 and the source terminal 2S with the gate cutoff circuit unit 3C or the current limiting circuit unit 3D being electrically connected to the power MOSFET gate terminal 2G1, MOSFETs which constitute the gate cutoff circuit unit 3C or the current limiting circuit unit 3D may be broken down because they are smaller in withstand voltage than the power MOSFET Qp. To prevent this problem, neither of the units 3C and 3D is electrically connected to the power MOSFET gate terminal 2G1.

The peripheral circuit-connected power source terminal 2G3 is electrically connected to the lead between the resistor R8 and the node E and is electrically connected to the protection circuit 3. The peripheral circuit-connected power source terminal 2G3 is disposed in the state of being adjacent to and insulated from the power MOSFET gate terminal 2G1, so that the peripheral circuit-connected power source terminal 2G3 can be electrically connected to the power MOSFET gate terminal 2G1 after the screening step.

The peripheral circuit-connected power source terminal 2G4 is electrically connected to the protection circuit 3 via the resistor R8. The peripheral circuit-connected power source terminal 2G5 is electrically connected to a gate protection circuit unit, the thermal sense circuit unit 3A and the latch circuit unit 3B. The peripheral circuit-connected power source terminals 2G4 and 2G5 are disposed in the state of being adjacent to and insulated from each other, so that the terminals 2G4 and 2G5 can be electrically connected to each other after the screening step.

Incidentally, in the gate protection circuit unit, the diodes D1a to D1d and D2 and the resistor R2 and the like which have been described previously in connection with the first embodiment and the like (refer to FIG. 2) are formed.

FIG. 22 is a diagram showing the equivalent circuit of the power IC 1 which is obtained after the screening step. As shown in FIG. 22, the power MOSFET gate terminal 2G1 and the peripheral circuit-connected power source terminal 2G3 are electrically connected to each other. The terminals 2G1 and 2G3 may be electrically connected to each other by using a bonding ball, as described above in connection with the fourth embodiment.

The peripheral circuit-connected power source terminals 2G4 and 2G5 are electrically connected to each other, and are also electrically connected to the gate terminal 2G. The terminals 2G4, 2G5 and 2G may be electrically connected by using bonding wires, as described above in connection with the first embodiment. Thus, the gate terminal 2G of the power IC 1 is electrically connected to the gate electrode of the power MOSFET Qp and to the protection circuit 3, thereby forming the power IC 1.

In the fifth embodiment as well, it is possible to obtain the effects (1) to (6) obtained in the previously-described first embodiment.

Sixth Embodiment

Figure 23:
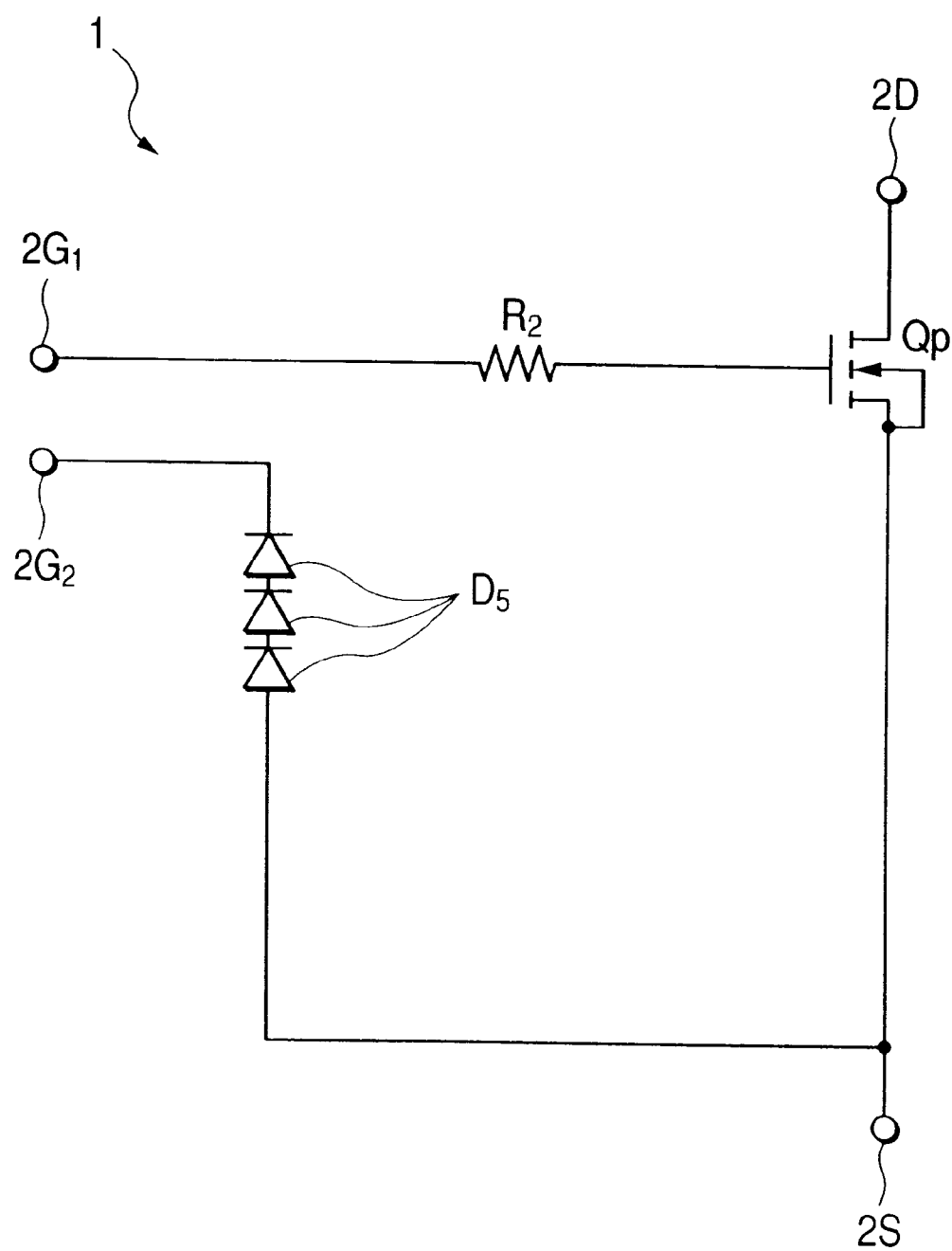
FIG. 23 is a diagram of an equivalent circuit which is obtained at an intermediately stage in the process of manufacturing a semiconductor integrated circuit device according to another embodiment of the present invention.

FIG. 23 is a diagram of an equivalent circuit which is obtained in the process of manufacturing a semiconductor integrated circuit device according to another embodiment of the present invention.

A sixth embodiment which will be described below relates to a basic power IC which has a gate protection circuit unit, but does not have the above-described thermal sense circuit unit, latch circuit unit and current limiting circuit unit.

FIG. 23 is a diagram of the equivalent circuit of the power IC 1 of the sixth embodiment which is obtained immediately before the screening step.

The power MOSFET gate terminal 2G1 is electrically connected to the gate electrode of the power MOSFET Qp via a protection resistor R2 for a gate protection circuit. The (peripheral circuit-connected) first power source terminal 2G2 is electrically connected to the source terminal 2S via protection diodes D5 for the gate protection circuit. Incidentally, the source terminal 2S is not divided.

In the screening step, a screening voltage is applied between the power MOSFET gate terminal 2G1 and the source terminal 2S. During this time, the (peripheral circuit-connected) first power source terminal 2G2 is kept open. Thus, a high screening voltage can be applied to the power MOSFET Qp without being limited by the voltage characteristic of the diodes D5 for the gate protection circuit.

After the screening step, the power MOSFET gate terminal 2G1 and the (peripheral circuit-connected) first power source terminal 2G2 are electrically connected to each other as described above in connection with each of the first to fifth embodiments and the like, thereby forming the gate terminal 2G of the power IC 1.

In the sixth embodiment, it is possible to obtain the effects (1) to (8) obtained in the previously-described first embodiment.

Although the invention made by the present inventors has been specifically described with reference to the embodiments, the present invention is not limited to any of the above-described embodiments and various modifications can of course be made without departing from the spirit and scope of the present invention.

For example, although, in the first embodiment and the like, the thermal sense elements of the thermal sense circuit are disposed in the center of the power MOSFET area, the location of the thermal sense elements is not limited to the center of the power MOSFET area, and they may be disposed, for example, in the vicinity of the power MOSFET area.

In the foregoing description, reference has been chiefly made to a case in which the present invention made by the present inventors is applied to the technology of semiconductor integrated circuit devices having power MOSFETS which belongs to an industrial field of application which is a background of the present invention. However, the present invention is not limited to such a case, and can also be applied to, for example, the technology of semiconductor integrated circuit devices having insulated gate bipolar transistors or the like.

Effects which can be obtained from representative features of the present invention disclosed herein will be described in brief below.

(1) In accordance with the present invention, during a screening step, a comparatively high voltage which is necessary for screening of power MIS transistors can be applied between the gate and the source of each of the power MIS transistors without being limited by a peripheral circuit.

(2) According to the above effect (1), since it is possible to reliably eliminate power MIS transistors having latent defects, it is possible to finally provide a semiconductor integrated circuit device having highly reliable power MIS transistors.

(3) According to the above effect (1), since the screening voltage can be made high, it is possible to improve the acceleration of screening and, hence, shorten screening time.

(4) In accordance with the present invention, during a wire bonding step which has heretofore been carried out, power MIS transistors and peripheral circuits can be connected to each other without altering or increasing manufacturing steps nor introducing new assembly techniques. In other words, it is possible to manufacture a semiconductor integrated circuit device having highly reliable power MIS transistors without altering or increasing manufacturing steps nor introducing new assembly techniques.

(5) According to the above effect (4), it is possible to manufacture a semiconductor integrated circuit device having highly reliable power MIS transistors without incurring a great increase in manufacturing cost.

(6) In accordance with the present invention, since a peripheral circuit-connected GND terminal is provided above a field insulating film, it is possible to moderate damage during bonding of bonding wires in a wire bonding step.

(7) In accordance with the present invention, since the peripheral circuit-connected GND terminal is provided above the field insulating film, it is possible to moderate damage during bonding of bonding, the height of the top of the peripheral circuit-connected GND terminal can be made larger than the height of the top of a power MIS transistor-connected source terminal, so that a defective connection between the peripheral circuit-connected GND terminal and the power MIS transistor source terminal.

(8) In accordance with the present invention, the base region of a parasitic bipolar transistor which is formed on the drain side of a lateral MIS transistor is formed in a first semiconductor area which is lower in impurity concentration than the channel region of a power MIS transistor. Accordingly, since a withstand voltage VCEO of the parasitic bipolar transistor can be made sufficiently larger than the screening voltage, it is possible to avoid the problem of leak current due to the parasitic bipolar transistor.

What is claimed is:

1. A semiconductor integrated circuit device comprising: a single semiconductor substrate comprising:
a first terminal;
a second terminal;
a third terminal;
a fourth terminal;
an insulated gate transistor having a first current path coupled between said second terminal and said third terminal, and a gate terminal coupled to said first terminal; and
a protection circuit which prevents a breakdown of a first gate insulating film in said insulated gate transistor, and which is coupled between said third terminal and said fourth terminal;
a first wire;
a second wire;
a first lead which is coupled to one end of the first wire, and
a second lead which is coupled to one end of the second wire,
wherein said first and fourth terminals are coupled to the other end of the first wire, and
wherein said third terminal is coupled to the other end of the second wire.

2. A semiconductor integrated circuit device comprising: a single semiconductor substrate comprising:
a first terminal;
a second terminal;
a third terminal;
a fourth terminal;
an insulated gate transistor having a first current path coupled between said second terminal and said third terminal, and a gate terminal coupled to said first terminal; and
a protection circuit which prevents a breakdown of a first gate insulating film in said insulated gate transistor, and which is coupled between said third terminal and said fourth terminal;
a first wire;
a second wire;
a third wire;
a first lead which is coupled to said first terminal by the first wire and to said fourth terminal by the second wire; and
a second lead which is coupled to said third terminal by the third wire.

3. A semiconductor integrated circuit device according to claim 1, wherein said protection circuit includes a plurality of zener diodes coupled between the third terminal and the fourth terminal and protecting a first gate insulating film of the insulated gate transistor from being destroyed.

4. A semiconductor integrated circuit device according to claim 3, wherein said second terminal is a drain terminal of the insulated gate transistor, and wherein said third terminal is a source terminal of the insulated gate transistor.

5. A semiconductor integrated circuit device according to claim 1,
wherein said protection circuit includes a thermal sense circuit which detects a temperature of the semiconductor integrated circuit device, and which outputs an output signal when the detected temperature value is higher than a predetermined temperature value, and
wherein the insulated gate transistor is turned off if the thermal sense circuit outputs the output signal.

6. A semiconductor integrated circuit device according to claim 5, wherein said protection circuit includes a latch circuit which holds the output signal.

7. A semiconductor integrated circuit device according to claim 6,
wherein said thermal sense circuit and said latch circuit include a plurality of MOSFETs each having a second gate insulating film that is thinner than the first gate insulating film of said insulated gate transistor.

8. A semiconductor integrated circuit device according to claim 1,
wherein the first terminal is constructed by a first conductor film having a predetermined pattern on the single semiconductor substrate, and
wherein the fourth terminal is constructed by a second conductor film having a predetermined pattern on the single semiconductor substrate, so that the fourth terminal surrounds the first terminal while electrically disconnecting the first terminal from the fourth terminal.

9. A semiconductor integrated circuit device comprising:
a single semiconductor substrate comprising:
 a first terminal;
 a second terminal;
 a third terminal;
 a fourth terminal;
 a first insulating gate transistor having a first current path coupled between said second terminal and said third terminal, and a gate terminal coupled to said first terminal; and
 a first protection circuit which limits a drain current flowing via the first current path of said first insulated gate, and which is coupled between said first terminal and said fourth terminal;
 a first wire;
 a second wire;
 a first lead which is coupled to one end of the first wire; and
 a second lead which is coupled to one end of the second wire;
 wherein said third and fourth terminals are coupled to the other end of the first wire, and
 wherein said first terminal is coupled to the other end of the second wire.

10. A semiconductor integrated circuit device comprising:
a single semiconductor substrate comprising:
 a first terminal;
 a second terminal;
 a third terminal;
 a fourth terminal;
 a first insulating gate transistor having a first current path coupled between said second terminal and said third terminal, and a gate terminal coupled to said first terminal; and
 a first protection circuit which limits a drain current flowing via the first current path of said first insulated gate, and which is coupled between said first terminal and said fourth terminal;
 a first wire;
 a second wire;
 a third wire;
 a first lead which is coupled to said third terminal by the first wire, to said fourth terminal by a the second wire, and
 a second lead which is coupled to said first terminal by the third wire.

11. A semiconductor integrated circuit device comprising:
a single semiconductor substrate comprising:
 a first terminal;
 a second terminal;
 a third terminal;
 a fourth terminal;
 a first insulating gate transistor having a first current path coupled between said second terminal and said third terminal, and a gate terminal coupled to said first terminal; and
 a first protection circuit which limits a drain current flowing via the first current path of said first insulated gate, and which is coupled between said first terminal and said fourth terminal;
 a first wire;
 a second wire;
 a first lead which is coupled to one end of the first wire; and
 a second lead which is coupled to one end of the second wire;
 wherein said third and fourth terminals are coupled to the other end of the first wire,
 wherein said first terminal is coupled to the other end of the second wire, and
 wherein said third terminal is coupled to said fourth terminal by a metallic ball.

12. A semiconductor integrated circuit device according to claim 9,
wherein said protection circuit includes:
 a second insulating gate having a second current path coupled between said second terminal and said fourth terminal, and a gate terminal coupled to said first terminal;
 a switching transistor which has a current path coupled between the gate terminal of the second insulating gate transistor and the fourth terminal and a gate terminal coupled to the second current path of the second insulating gate transistor, and
 a current detection circuit coupled between the gate terminal of the switching transistor and the fourth terminal;
  wherein the switching transistor is controlled in a switching operation by a current flowing via the second current path of the second insulated gate transistor to the current detection circuit so as to limit a current flowing through the first current path of the first insulating gate transistor.

13. A semiconductor integrated circuit device according to claim 12,
wherein said first insulating gate transistor is a first MOSFET having a gate oxide film;
wherein said second insulating gate transistor is a second MOSFET having a gate oxide film, and
wherein said switching transistor is a third MOSFET having a gate oxide film.

14. A semiconductor integrated circuit device according to claim 13,
wherein the gate oxide film of said third MOSFET has a predetermined thickness thinner than that of the gate oxide film of the first MOSFET.

15. A semiconductor integrated circuit device according to claim 9,
wherein said protection circuit includes:
a thermal sense circuit which detects a temperature of the semiconductor integrated circuit device, and which outputs an output signal when the detected temperature value has a temperature value higher than a predetermined temperature value;
a latch circuit which holds the output signal, and
a gate cutoff circuit which cuts-off an input voltage supplied with the gate terminal of said first insulating gate transistor in response to the held output signal.

16. A semiconductor integrated circuit device according to claim 9,
wherein said protection circuit includes zener diodes which prevent a breakdown of a first gate insulating film in said first insulating gate transistor, and which are coupled between said first terminal and said fourth terminal,
wherein the fourth terminal is constructed by a second conductor film having a predetermined pattern on the single semiconductor substrate so that the fourth terminal surrounds the third terminal while electrically disconnecting the third terminal from the fourth terminal.

17. A semiconductor integrated circuit device according to claim 9, further comprising a conductor film pattern of said third terminal which is formed on the single semiconductor substrate, and a conductor film pattern of said fourth terminal which is formed on the single semiconductor substrate,
wherein one of the conductor film patterns is formed as is surrounded by the other of the conductor film patterns.

18. A semiconductor integrated circuit device comprising:
a single semiconductor substrate comprising:
a first terminal;
a second terminal;
a third terminal;
a fourth terminal;
a fifth terminal;
a first insulated gate transistor having a first current path coupled between said second terminal and said third terminal, and a gate terminal coupled to said first terminal;
a first protection circuit which prevents a breakdown of a gate insulating film in said first insulated gate transistor, the first protection circuit being coupled between the fourth terminal and the fifth terminal; and
a second protection circuit which limits a drain current flowing via the first current path of said first insulated gate transistor, the second protection circuit being coupled between the gate terminal of the first insulated gate transistor and the fifth terminal;
a first lead;
a second lead;
a third lead coupled to the second terminal;
a first wire having one end and the other end, the one end being coupled to both the first terminal and the fourth terminal; and the other end being coupled to the first lead;
a second wire having one and another end, the one end being coupled to both the third terminal and the fifth terminal; and the other end being coupled to the second lead.

* * * * *